US008922685B2

(12) United States Patent
Nakata et al.

(10) Patent No.: US 8,922,685 B2
(45) Date of Patent: Dec. 30, 2014

(54) SOLID-STATE IMAGE SENSING DEVICE AND CAMERA SYSTEM WITH DIVIDED PIXELS

(75) Inventors: Masashi Nakata, Kanagawa (JP); Eiichi Funatsu, Tokyo (JP)

(73) Assignee: Sony Corporation, Tokyo (JP)

( * ) Notice: Subject to any disclaimer, the term of this patent is extended or adjusted under 35 U.S.C. 154(b) by 551 days.

(21) Appl. No.: 13/317,017

(22) Filed: Oct. 7, 2011

(65) Prior Publication Data
US 2012/0113290 A1 May 10, 2012

(30) Foreign Application Priority Data

Nov. 8, 2010 (JP) ................................ 2010-250328

(51) Int. Cl.
*H04N 5/335* (2011.01)
*H04N 5/378* (2011.01)
*H04N 9/04* (2006.01)
*H04N 5/3745* (2011.01)
*H04N 5/355* (2011.01)
*H04N 5/228* (2006.01)

(52) U.S. Cl.
CPC .............. *H04N 5/378* (2013.01); *H04N 9/045* (2013.01); *H04N 5/37457* (2013.01); *H04N 5/35554* (2013.01)
USPC ...... 348/294; 348/222.1; 348/362; 250/208.1

(58) Field of Classification Search
CPC . H04N 5/23232; H04N 5/2355; H04N 5/353; H04N 5/35536; H04N 5/35581; H04N 3/1556; H04N 5/374
USPC ............... 348/222.1, 294, 302, 362, E05.037, 348/E05.031
See application file for complete search history.

(56) References Cited

U.S. PATENT DOCUMENTS 8,310,573 B2 * 11/2012 Hirota ........................... 348/275
2005/0195304 A1 9/2005 Nitta et al.
(Continued)

FOREIGN PATENT DOCUMENTS

JP 55-035592 * 3/1980 ............... H04B 1/64
JP 03-117281 5/1991
(Continued)

OTHER PUBLICATIONS

Japanese Office Action issued May 13, 2014 for corresponding Japanese Application No. 2010-250328.

(Continued)

*Primary Examiner* — Hung Lam
(74) *Attorney, Agent, or Firm* — Rader, Fishman & Grauer PLLC

(57) ABSTRACT

A solid-state image sensing device includes: a pixel part in which pixels are arranged in a matrix; and a pixel signal readout part including an AD conversion part that analog-digital (AD)-converts a pixel signal read out from the pixel part. Each of the adjacent pixels or one of the pixels of the pixel part is formed as divided pixels divided into regions with different photosensitivity or amounts of accumulated charge, photosensitivity or exposure time conditions are set for the divided pixels and the photosensitivity or exposure time conditions of the divided pixels provided to be opposed in diagonal directions are set to the same conditions, the pixel signal readout part reads out divided pixel signals of the respective divided pixels of the pixel, and the AD conversion part obtains a pixel signal of one pixel by AD-converting the respective read out divided pixel signals and adding the signals.

20 Claims, 18 Drawing Sheets

(56) References Cited

U.S. PATENT DOCUMENTS

| | | | |
|---|---|---|---|
| 2007/0014019 A1* | 1/2007 | Mouli | 359/619 |
| 2008/0062290 A1* | 3/2008 | Lahav et al. | 348/280 |
| 2008/0143841 A1 | 6/2008 | Tico et al. | |
| 2008/0267526 A1* | 10/2008 | Mitsunaga et al. | 382/274 |
| 2009/0314928 A1* | 12/2009 | Parks | 250/208.1 |
| 2010/0013969 A1* | 1/2010 | Ui | 348/294 |
| 2010/0134648 A1* | 6/2010 | Funatsu et al. | 348/222.1 |
| 2011/0127408 A1* | 6/2011 | Yanagita et al. | 250/208.1 |

FOREIGN PATENT DOCUMENTS

| | | |
|---|---|---|
| JP | 09-205589 | 8/1997 |
| JP | 2002-165226 A | 6/2002 |
| JP | 2004-320119 | 11/2004 |
| JP | 2005-278135 | 10/2005 |
| JP | 2005-328323 A | 11/2005 |
| JP | 2010-028423 A | 2/2010 |
| JP | 2010-136226 A | 6/2010 |
| JP | 2010-284213 | 12/2010 |

OTHER PUBLICATIONS

Japanese Office Action issued Aug. 12, 2014 for corresponding Japanese Application No. 2010-250328.

* cited by examiner

BAYER ARRANGEMENT

※ONE PIXEL IS DIVIDED INTO FOUR AND SENSITIVITY OR
ACCUMULATION TIME IS VARIED WITH RESPECT TO EACH DIVIDED PIXEL

SQUARE DIVISION INTO
FOUR (SHARED FD)

SQUARE DIVISION INTO
FOUR (INDIVIDUAL FD)

RECTANGULAR DIVISION
INTO FOUR (SHARED FD)

RECTANGULAR DIVISION
INTO FOUR (INDIVIDUAL FD)

CONFIGURATION EXAMPLE OF COLUMN AD CONVERSION TYPE CMOS IMAGE SENSOR CIRCUIT RELATED TO DIVIDED PIXEL ADDITION

CONFIGURATION EXAMPLE OF COLUMN AD CONVERSION TYPE CMOS IMAGE SENSOR CIRCUIT RELATED TO DIVIDED PIXEL ADDITION

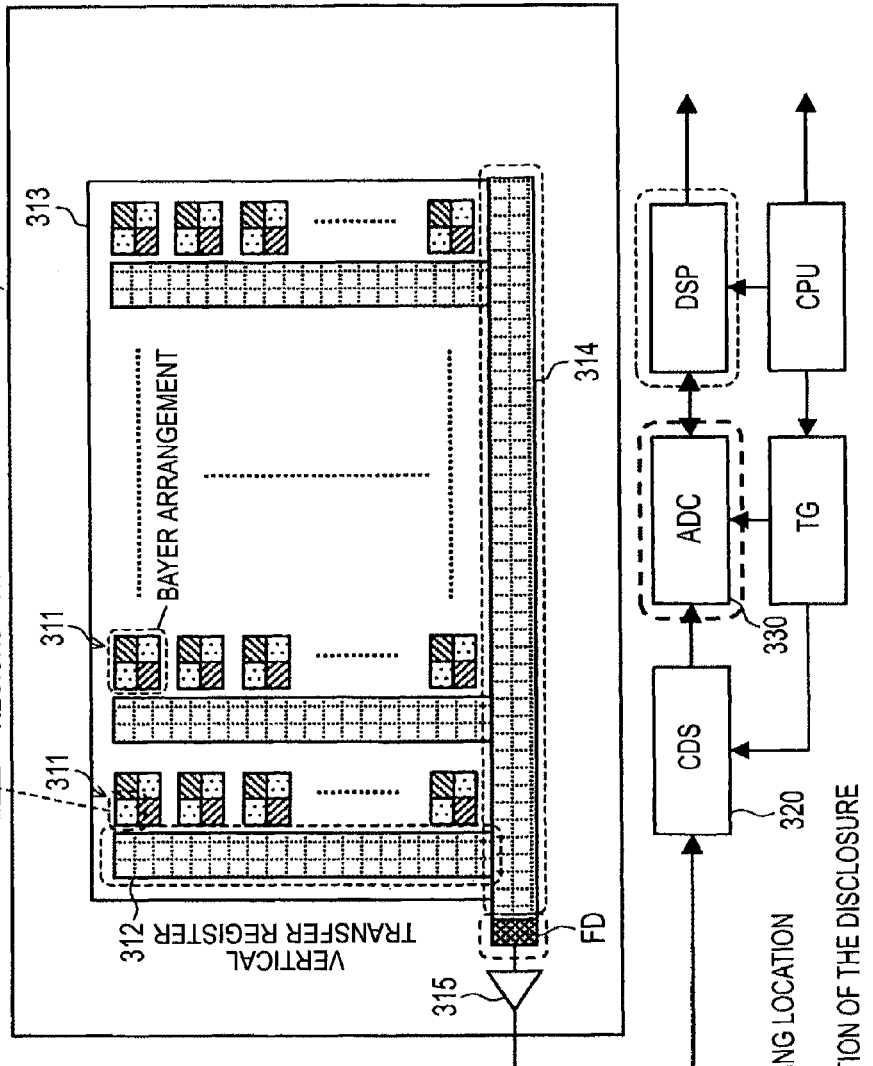

SOLID-STATE IMAGE SENSING DEVICE AND CAMERA SYSTEM WITH DIVIDED PIXELS

FIELD

The present disclosure relates to a solid-state image sensing device represented by a CCD or CMOS sensor and a camera system.

BACKGROUND

It has been desired to realize a solid-state image sensing device having a wide dynamic range that may enable shooting of details without losing details of high-brightness information even in backlit shooting with illumination light of headlights of cars and ball game grounds or sunlight or bringing an object image in the low-brightness part too much darker.

Under the circumstances, technologies of expanding dynamic ranges with respect to solid-state image sensing device such as CCDs are disclosed in Patent Document 1 (Japanese Patent No. 2125710), Patent Document 2 (JP-A-03-117281), Patent Document 3 (JP-A-09-205589), Patent Document 4 (JP-A-2004-320119), Patent Document 5 (JP-A-2005-278135), Patent Document 6 (JP-A-2010-284213), etc.

Patent Document 1 shows an example of expanding a dynamic range of a CCD by providing two or more plural regions (cells) having different sensitivity characteristics within one pixel of the CCD or the like to provide knee characteristics that input/output characteristics change in a stepwise fashion.

The knee characteristics refer to a characteristic curve shown by a relationship of the output current to the amount of exposure takes smaller values in a high-input region than those in a low-input region, and are often referred to as a high-brightness signal compression technology.

As methods of changing the photosensitivity of the photosensitive region (cell), for example, changing the aperture ratio of the device, providing an optical filter (ND filter), changing impurity concentration, etc. are described.

According to Patent Document 1, the example is applicable to an image sensing device of XY address-type other than the CCD, however, there is no detailed description.

Patent Document 2 discloses an example of realizing higher dynamic range without losing details with highlight of a light valve or the like using adjacent pixels in a photosensitive pixel cell of a CCD or cells with different photosensitivity characteristics as a pair and adding signal charge of the respective cells within one pixel using it as signal charge of the pixel.

In this case, as means for changing photosensitivity, cells with different pixel areas are paired, for example.

Patent Document 3 similarly divides one pixel of a sensitivity pixel cell of a CCD into two different regions, and mixes signal charge of the regions with different sensitivity of the same pixel in a vertical register and vertically transfers it. Further, in the technology, a video signal is formed by sorting the signal charge with different sensitivity into two horizontal transfer gates using a sorting gate, and clipping the signal at the high-sensitivity side using an external signal processing circuit and adding it to the signal at the low-sensitivity side.

In this case, the characteristic graph of the video signal output to the amount of incident light is a line graph, and the gradient is steep at the high-sensitivity side (low-illuminance side) and the gradient is mild at the low-sensitivity side (high-illuminance side).

Patent Document 4 discloses an improvement method, in an image sensing device including high-sensitivity imaging cells and low-sensitivity imaging cells, for a problem that RAW image data volume (raw data) becomes larger with data of both-cells.

Specifically, whether or not recording of image information of the high-brightness part is necessary is automatically determined by analyzing shot image information. If the determination is "YES", the RAW image data of the high-brightness part is recorded together with the information of the low-brightness part. If the determination is "NO", the information of the high-brightness part is not recorded, but only the RAW image data of the low-brightness part is recorded.

One pixel is formed by combining a main photosensitive pixel cell (with larger area and higher sensitivity: mainly using the center part of a microlens) and a sub-photosensitive pixel cell (with smaller area and lower sensitivity: provided at the edge side of the microlens).

Patent Document 5 discloses a CMOS image sensor including a column-parallel ADC having a comparator and an up/down counter. The CMOS image sensor can execute addition operation of pixel digital values over plural rows without additional circuits such as an adder and a line memory device.

However, compared to the pixel having an area as a total of all areas of target pixels in the case of the divided pixel addition, in the case of division, ineffective regions (dead spaces) that do not directly contribute to photosensitivity are produced in signal processing.

Accordingly, the areas of the divided individual cells are smaller than in the case of simple division into four, the number of saturated electrons decreases compared to the former case and the Shot noise relatively increases, and S/N of the divided individual cells is deteriorated.

Since the Shot noise is also added at each time of addition, S/N of the result of the divisional addition is deteriorated.

Further, addition processing of pixel signals is analog signal addition and the sensitivity is different with respect to each pixel, and thus, there are problems that the saturation values vary and the break point positions vary.

Furthermore, in the case of digital addition, it is necessary to provide a memory outside of the sensor.

That is, in the existing addition method of dividing one pixel cell into two or more plural pixel cells with different sensitivity or accumulation times and measuring the sensitivity as the amount of saturation charge Qs of the pixels, the amount of saturation charge Qs varies with respect to each pixel. Accordingly, the addition result varies with respect to each pixel for the same amount of light.

In other words, in the sensitivity curves (line graphs) with the amount of incident light as a horizontal axis and the amount of saturation charge Qs as a vertical axis, the break point positions (vertical axis) vary at the divided pixel cell addition points (horizontal axis).

Accordingly, Patent Document 6 suggests a method of realizing a wide dynamic range by applying a technology of regarding four pixels as one pixel and varying respective accumulation times of the four pixels. In this technology, four signals are added.

FIG. 1 is a diagram for explanation of a method of realizing a wide dynamic range by varying respective accumulation times of four pixels.

In the method, pixels formed by respectively dividing single colors of R, G, B into four are used.

Further, as shown by signs A to D in G (green) on the upper left of FIG. 1 as an example, a structure having four pixels with different photosensitivity or amounts of exposure is assumed. In FIG. 1, FD shows a floating diffusion part.

Furthermore, by summing the outputs of the four pixels, a wide dynamic range is realized.

According to the technology, divided pixel addition without variations in the number of output electrons of pixels may be realized, and the wide dynamic range in which the sensitivity is higher in the lower amount of incident light, the sensitivity is lower with the higher incident light, and the output is not saturated can be provided.

SUMMARY

However, the technology disclosed in Patent Document 6 has the following disadvantages.

The centers of gravity are different among the respective pixels and correction of shifts of the centers of gravity may be necessary.

As shown in FIG. 2, depending on the computation when the output signal is returned to be linear as from line X to line Y, S/N may not be maximized.

The problem of shifts of the centers of gravity will be explained further in detail.

When sensitivity/exposure is varied among four pixels, the centers of gravity vary among four pixels and the correction of shifts of the centers of gravity is necessary.

When the sensitivity/exposure is simply varied between two pixels, the centers of gravity vary among two pixels and the correction of shifts of the centers of gravity is also necessary.

Due to the difference in the centers of gravity, there may be the following disadvantages.

If the centers of gravity are different, the correction of shifts of the centers of gravity is necessary, and additionally, for example, when an object in the lateral direction like electric cables is shot using pixels with sensitivity/accumulation divided in the vertical direction as shown in FIG. 3, images obtained by the upper pixels and the lower pixels may be varied.

This may cause generation of false color or noise.

Next, the problem of S/N will be further described in detail.

When signals are formed from four pixels having different sensitivity/amounts of exposure, it is necessary that the final output value is linear relative to the amount of light as shown by Y in FIG. 2.

It is necessary that the obtained raw (Raw) signal value is made linear as shown by the line Y because the line is folded in the regions RG1 to RG4 in FIG. 2.

As a computation method in this regard, the following example is conceivable.

$$y=ax \qquad \text{Region "RG1" Expression}$$

$$y'=cx+d \qquad \text{Region "RG2" Expression}$$

(x=obtained signal value, y=final output)

In this case, to superimpose the "RG1" Expression on the "RG2" Expression, the "RG2" Expression may be made linear with respect to the "RG1" Expression by subtracting intercept d from "RG2" Expression for setting the intercept to zero, and multiplying by a/c.

However, in consideration of S (Signal)/N (Noise), regarding the interception d subtracted in this case, only S (Signal) is subtracted and both Signal and Noise are multiplied by a/c for multiplication (because Subtraction may be impossible for Noise).

Accordingly, S/N is largely deteriorated compared to that before computation.

Thus, it is desirable to provide a solid-state image sensing device and a camera system that may prevent shifts of the centers of gravity, maximize S/N, realize divided pixel addition without variations in the number of output electrons of pixels with respect to the amount of incident light, and have a wide dynamic range in which sensitivity is higher with a lower amount of incident light and sensitivity is lower with high incident light, and the output is not saturated.

A solid-state image sensing device according to one embodiment of the present disclosure includes a pixel part in which plural pixels are arranged in a matrix, and a pixel signal readout part including an AD conversion part that analog-digital (AD)-converts a pixel signal read out from the pixel part, wherein each of the plural adjacent pixels or one of the pixels of the pixel part is formed as plural divided pixels divided into regions with different photosensitivity or amounts of accumulated charge, plural photosensitivity or exposure time conditions are set for the plural divided pixels and the photosensitivity or exposure time conditions of the divided pixels provided to be opposed in diagonal directions are set to the same conditions, the pixel signal readout part reads out divided pixel signals of the respective divided pixels of the pixel, and the AD conversion part obtains a pixel signal of one pixel by AD-converting the respective read out divided pixel signals and adding the signals.

A solid-state image sensing device according to another embodiment of the present disclosure includes a pixel part in which plural pixels are arranged in a matrix, a pixel signal readout part including an AD conversion part that analog-digital (AD)-converts a pixel signal read out from the pixel part, and a processing part that obtains a final output by obtaining an optimal multiplying factor from an output value of the pixel signal readout part and multiplying the output value by the obtained multiplying factor, wherein each of the plural adjacent pixels or one of the pixels of the pixel part is formed as plural divided pixels divided into regions with different photosensitivity or amounts of accumulated charge, the pixel signal readout part reads out divided pixel signals of the respective divided pixels of the pixel, and the AD conversion part obtains a pixel signal of one pixel by AD-converting the respective read out divided pixel signals and adding the signals.

A camera system according to still another embodiment of the present disclosure includes a solid-state image sensing device, and an optical system that forms an object image on the solid-state image sensing device, the solid-state image sensing device including a pixel part in which plural pixels are arranged in a matrix, and a pixel signal readout part including an AD conversion part that analog-digital (AD)-converts a pixel signal read out from the pixel part, wherein each of the plural adjacent pixels or one of the pixels of the pixel part is formed as plural divided pixels divided into regions with different photosensitivity or amounts of accumulated charge, plural photosensitivity or exposure time conditions are set for the plural divided pixels and the photosensitivity or exposure time conditions of the divided pixels provided to be opposed in diagonal directions are set to the same conditions, the pixel signal readout part reads out divided pixel signals of the respective divided pixels of the pixel, and the AD conversion part obtains a pixel signal of one pixel by AD-converting the respective read out divided pixel signals and adding the signals.

A camera system according to yet another embodiment of the present disclosure includes a solid-state image sensing device, and an optical system that forms an object image on the solid-state image sensing device, the solid-state image sensing device including a pixel part in which plural pixels are arranged in a matrix, a pixel signal readout part including an AD conversion part that analog-digital (AD)-converts a pixel signal read out from the pixel part, and a processing part that obtains a final output by obtaining an optimal multiplying factor from an output value of the pixel signal readout part and multiplying the output value by the obtained multiplying factor, wherein each of the plural adjacent pixels or one of the pixels of the pixel part is formed as plural divided pixels divided into regions with different photosensitivity or amounts of accumulated charge, the pixel signal readout part reads out divided pixel signals of the respective divided pixels of the pixel, and the AD conversion part obtains a pixel signal of one pixel by AD-converting the respective read out divided pixel signals and adding the signals.

According to the embodiments of the present disclosure, shifts of the centers of gravity can be prevented and S/N can be maximized, and divided pixel addition without variations in the number of output electrons of the pixels with respect to the amount of incident light may be realized. As a result, the wide dynamic range in which the sensitivity is higher in the lower amount of incident light, the sensitivity is lower with the higher incident light, and the output is not saturated can be provided.

BRIEF DESCRIPTION OF THE DRAWINGS

FIG. 18 is a diagram showing a configuration example of a solid-state image sensing device corresponding to a CCD sensor according to the embodiment of the present disclosure.

DETAILED DESCRIPTION

As below, embodiments of the present disclosure will be explained with reference to the drawings.

The explanation will be made in the following order.
1. Overall Schematic Configuration of Solid-state Image Sensing Device
2. Measures for Shifts of Centers of Gravity
3. Measures for S/N
4. Configuration Example of Divided Pixel
5. Configuration Example of Camera System <1. Overall Schematic Configuration of Solid-State Image Sensing Device>

Figure 4:
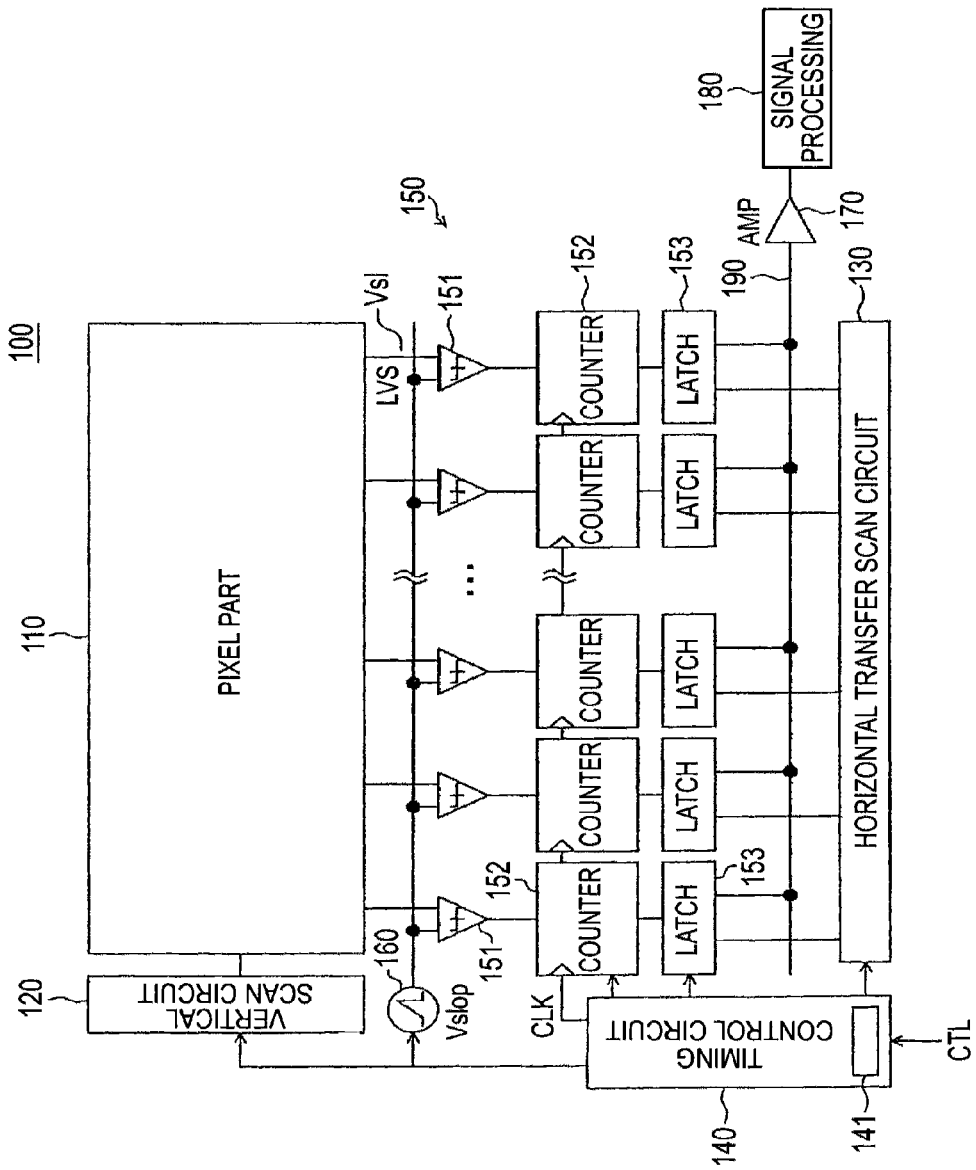
FIG. 4 is a diagram showing a configuration example of a CMOS image sensor (solid-state image sensing device) according to an embodiment of the present disclosure.
Figure 5:
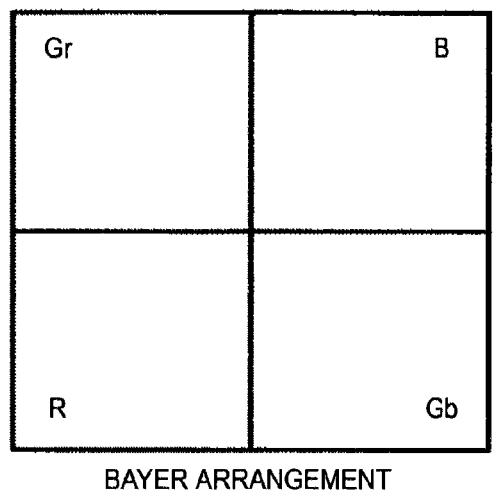
FIG. 5 is a diagram showing Bayer arrangement as a pixel arrangement example.

FIG. 4 is a block diagram showing a configuration example of a solid-state image sensing device (CMOS image sensor) with column parallel ADC according to an embodiment of the present disclosure.

The disclosure is applicable not only to the CMOS image sensor but to a CCD. Here, the CMOS image sensor will be explained as an example.

The solid-state image sensing device 100 has a pixel part 110, a vertical scan circuit 120, a horizontal transfer scan circuit 130, a timing control circuit 140, and an analog digital converter (ADC) group 150 as shown in FIG. 4.

The solid-state image sensing device 100 further has a digital-analog converter (DAC) 160, an amplifier circuit (S/A) 170, a signal processing circuit 180, and a horizontal transfer line 190.

The vertical scan circuit 120, the horizontal transfer scan circuit 130, the timing control circuit 140, the ADC group 150, and the DAC 160 form a pixel signal readout part.

The pixel part 110 includes plural pixels arranged in a matrix.

Figure 1:
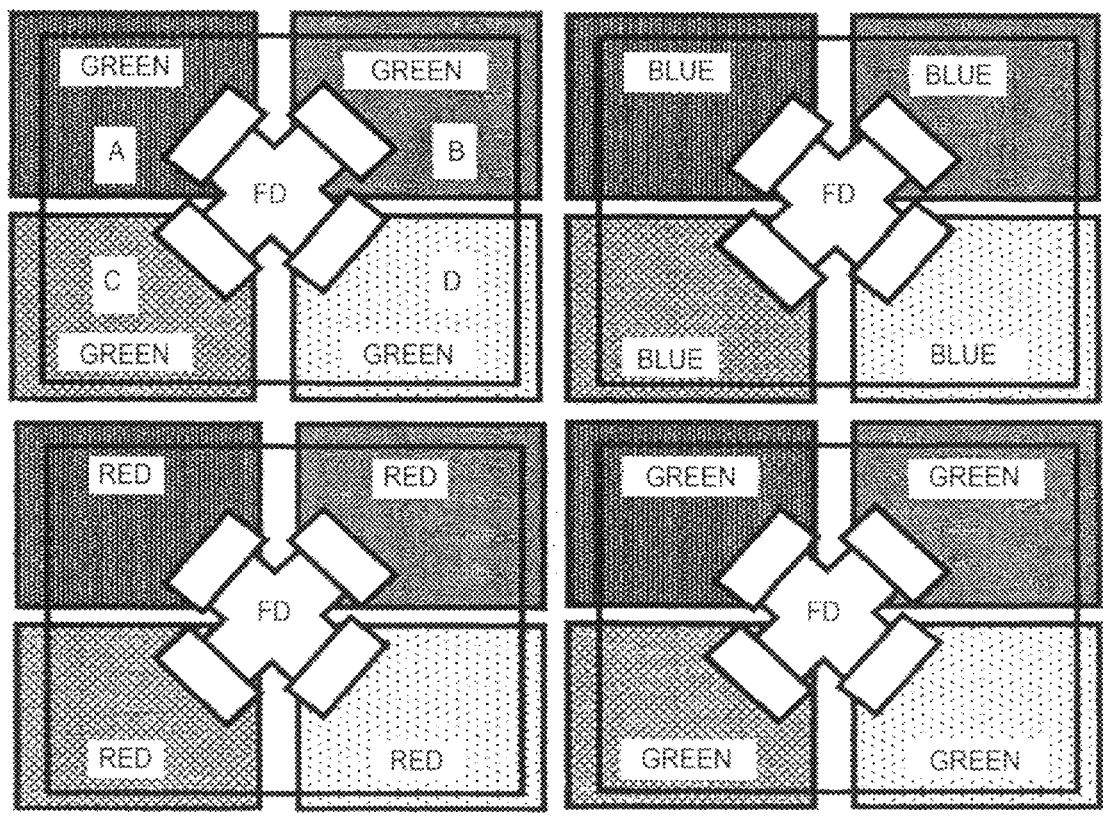
FIG. 1 is a diagram for explanation of a method of realizing a wide dynamic range by varying respective accumulation times of four pixels.
Figure 2:
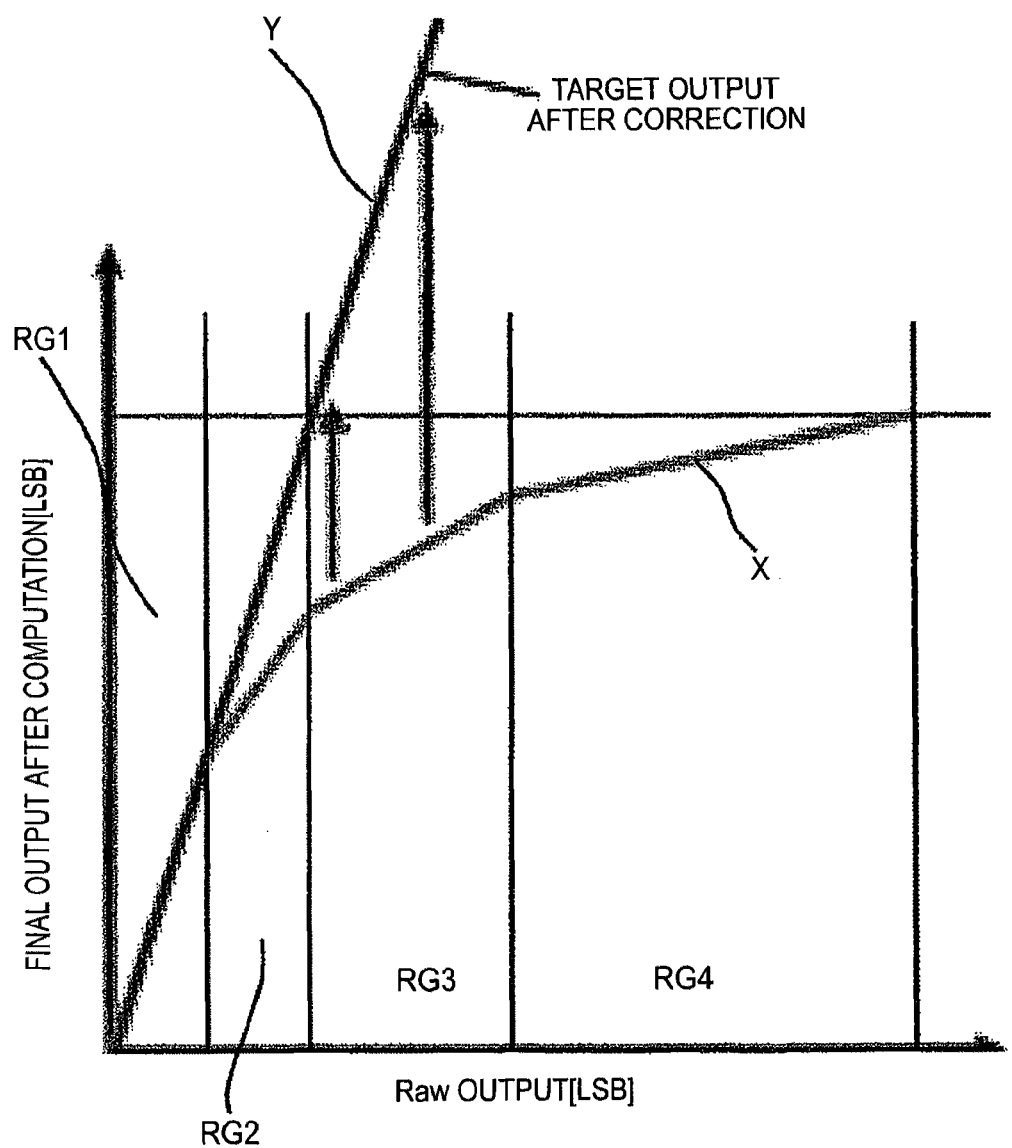
FIG. 2 is a diagram showing relationships between raw (Raw) output and final output after computation for consideration of a problem of S/N in the method of realizing a wide dynamic range by varying respective accumulation times of four pixels.
Figure 3:
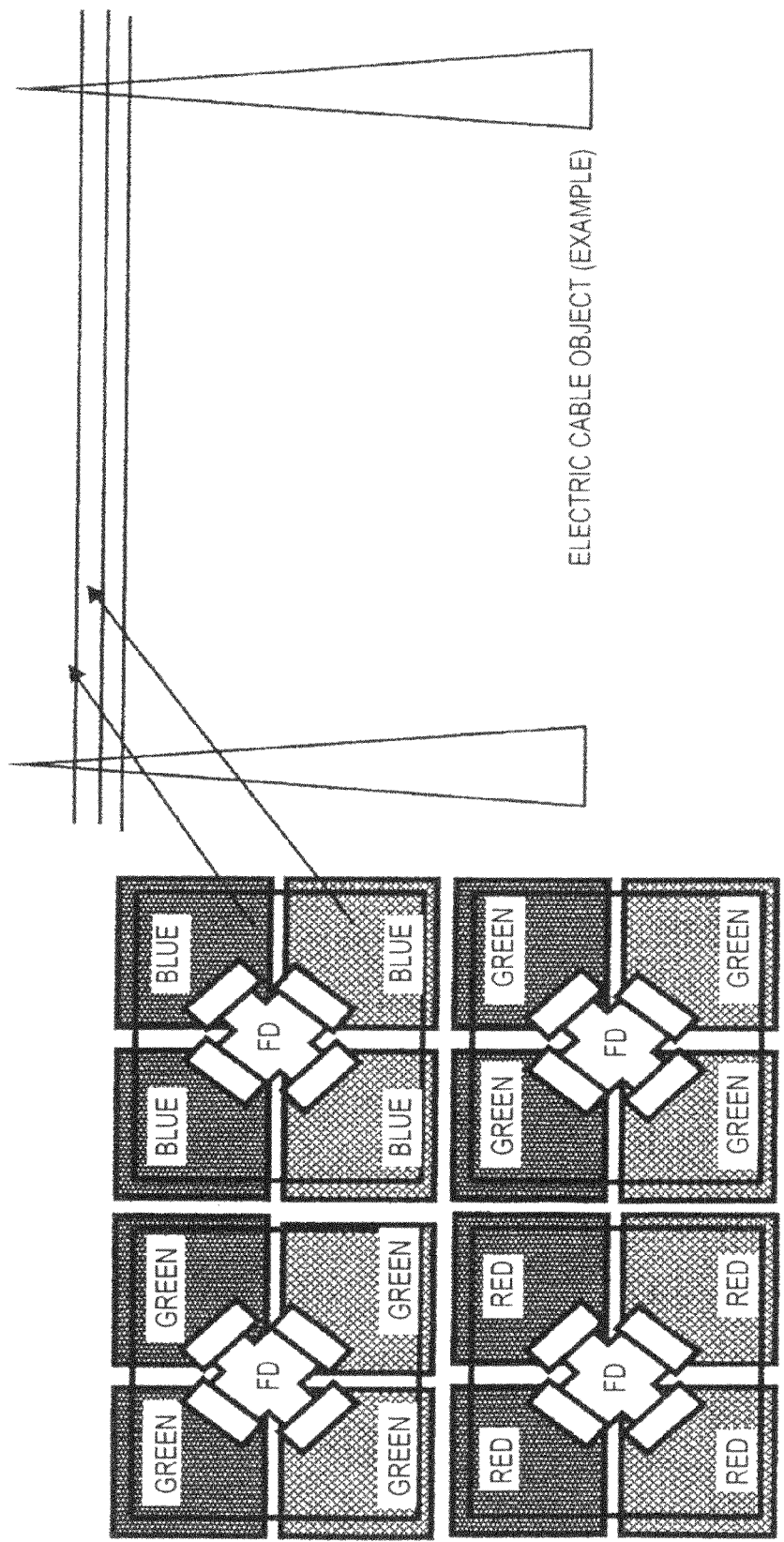
FIG. 3 is a diagram for consideration of a problem due to variations of centers of gravity in the method of realizing a wide dynamic range by varying respective accumulation times of four pixels.

The pixel part 110 employs Bayer arrangement as shown in FIG. 2, for example, as its pixel arrangement.

In the pixel part 110 of the embodiment, one pixel is divided into divided pixel cells DPC containing photoelectric conversion elements formed by photodiodes.

Specifically, in the solid-state image sensing device (CMOS image sensor) with column parallel ADC 100, one pixel under color filters of the same color in the Bayer arrangement is divided into two or more plural divided pixel cells DPC with different sensitivity or accumulation times.

Further, in the embodiment, as will be described later, for prevention of shifts of the centers of gravity, a structure under two conditions of exposure time conditions (or photosensitivity) with pixels opposed to each other in the diagonal direction having the same exposure time (or photosensitivity) is employed.

Further, in the embodiment, to maximize S/N, a configuration in which, when the signal is returned to be linear, the signal is not directly obtained by computation, but the final output is obtained by once calculating an optimal multiplying factor from a raw (Raw) output value and multiplying the raw (Raw) output value by the multiplying factor is employed.

Furthermore, when the pixel signal is AD-converted and output in the column direction, the AD-conversion is performed after addition of the output divided pixel signal of the divided pixel. In this regard, the input range to the AD-conversion part is clipped to be constantly equal to or less than the saturated output voltage of each pixel so that the output value of each pixel may be certainly a specific digital value.

In the following explanation, an example in which one pixel DPC is divided into four divided pixel cells DPC-A to DPC-D will be explained.

Figure 6:
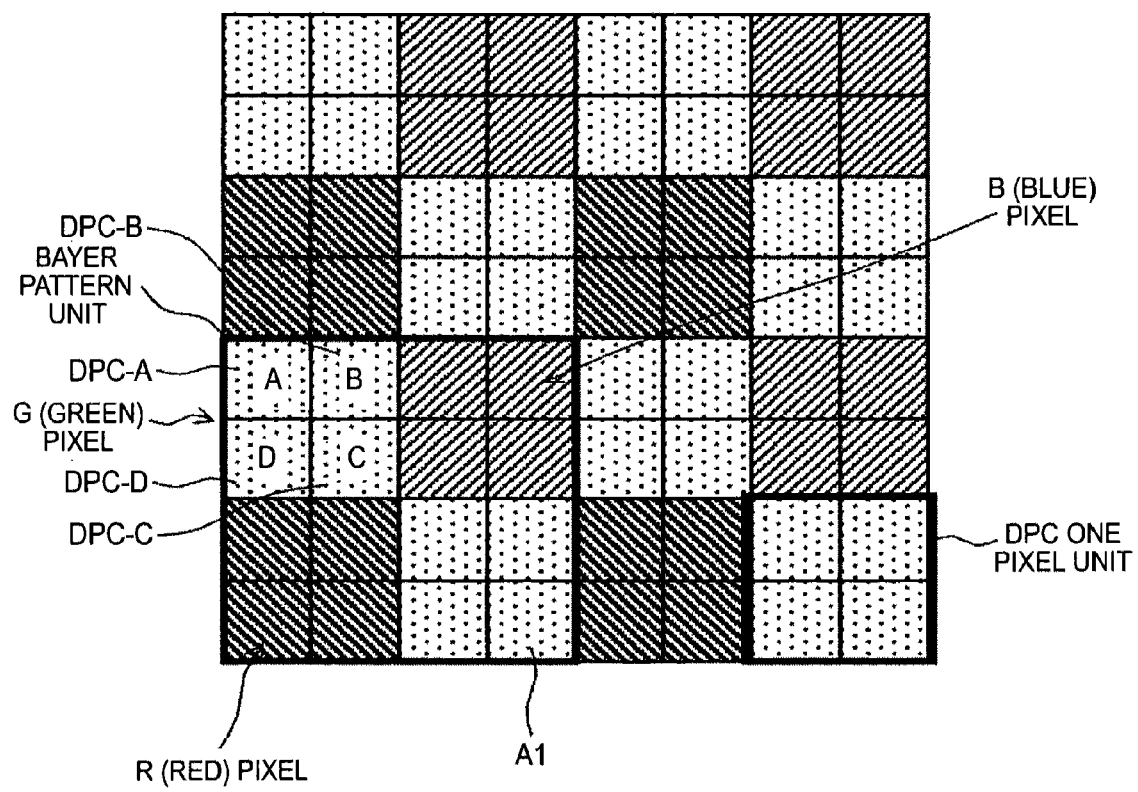
FIG. 6 is a conceptual diagram of pixel division according to the embodiment.

FIG. 6 is a conceptual diagram of pixel division according to the embodiment of the present disclosure.

FIG. 6 shows the case where a G (green) pixel PCG is divided into four pixels of DPC-A, DPC-B, DPC-C, DPC-D.

In FIG. 6, a division method in the case of Bayer arrangement is shown, and, in the example in which one pixel under the filters of the same color is divided into four, sensitivity and accumulation times are different in the divided pixels as below.

That is, for prevention of shifts of the centers of gravity, there are two conditions of exposure time conditions (or photosensitivity) and pixels opposed to each other in the diagonal directions have the same exposure times (or photosensitivity).

For example, in the example of the G pixel in FIG. 6, the pixels opposed to each other in the diagonal directions DPC-A and DPC-C, DPC-B and DPC-D have the same exposure times.

The configurations, division forms, etc. of the pixels and divided pixels in the pixel part 110 will be described later in detail.

Further, for example, the solid-state image sensing device 100 of the embodiment time-sequentially sends out divided pixel signals amplified within the pixel to the vertical signal line and executes AD-conversion in the AD-convertor (AD-conversion part) of the ADC group 150 provided in a column pixel signal readout part.

Then, when performing the AD-conversion operation of the second divided pixel signal, the solid-state image sensing device 100 adds the first AD-converted value and executes the AD-conversion operation of the second divided pixel signal.

Then, when performing the AD-conversion operation of the third divided pixel signal, the solid-state image sensing device 100 adds the second AD-converted value and executes the AD-conversion operation of the third divided pixel signal.

Then, when performing AD-conversion operation of the fourth divided pixel signal, the solid-state image sensing device 100 adds the third AD-converted value and executes the AD-conversion operation of the fourth divided pixel signal.

The solid-state image sensing device of the embodiment employs a divided pixel addition method of sequentially adding the pixel signals of the pixels divided into plural parts by the AD converter provided in the column part in this manner is employed.

In the solid-state image sensing device 100, as control circuits for sequentially reading out the signals of the pixel part 110, the timing control circuit 140 that generates internal clocks, the vertical scan circuit 120 that controls row addresses and row scanning, and the horizontal transfer scan circuit 130 that controls column addresses and column scanning are provided.

The ADC group 150 has a comparator 151 that compares a reference voltage Vslop as a ramp waveform in which the reference voltage generated by the DAC 160 is changed in a stepwise manner with analog signals (potentials Vsl) obtained from pixels with respect to each row via the vertical signal line LVS.

In the ADC group 150, ADCs each having an up-down counter (hereinafter, simply referred to as "counter") 152 that counts a comparison time and a latch 153 that holds a count result are arranged in plural columns.

The ADC group 150 has an n-bit digital signal conversion function and is provided with respect to each vertical signal line (column line), and thereby, a column-parallel AD block is formed.

The outputs of the respective latches 153 are connected to the horizontal transfer line 190 having a 2n-bit width, for example.

Further, 2n amplifier circuits 170 corresponding to the horizontal transfer line 190 and the signal processing circuit 180 are provided.

In the ADC group 150, the analog signal (potential Vsl) read out to the vertical signal line LVS is compared with the reference voltage Vslop (a slope waveform that changes to a linear shape with a certain gradient) in the comparator (comparator) 151 provided with respect to each column.

In this regard, the counter 152 provided with respect to each column similarly to the comparator 151 operates and the potential Vslop having the ramp waveform and the counter value change in one-to-one correspondence, and thereby, the potential (analog signal) Vsl of the vertical signal line LVS is converted into the digital signal.

The change of the reference potential Vslop is conversion of change in voltage into change in time, and the ADC performs conversion into a digital value by counting the times in a certain period (clock).

Further, when the analog electric signal Vsl and the reference voltage Vslop intersect, the output of the comparator 151 is inverted, the input clock of the counter 152 is stopped or the clock with its input having been stopped is input to the counter 152, and thereby, one AD conversion is completed.

For example, by continuously performing the up and down count processing of the counter in the number of divided pixel signals without resetting the counter, the divided pixel addition as addition by the above described AD convertor is realized.

Figure 7:
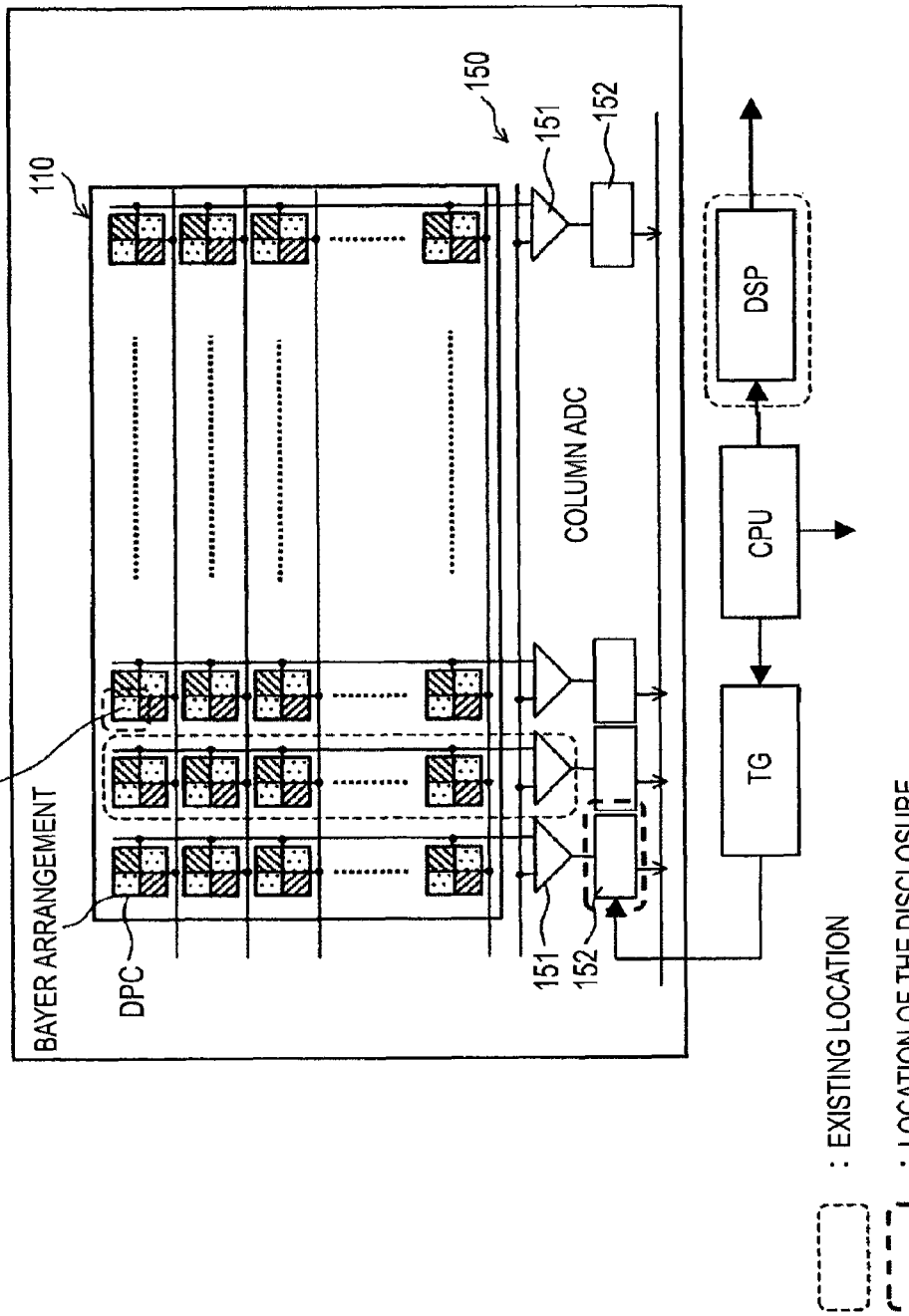
FIG. 7 is a diagram showing locations where addition processing is performed in the solid-state image sensing device (CMOS image sensor) with column-parallel ADC in FIG. 1.

FIG. 7 is a diagram showing locations where addition processing is performed in the solid-state image sensing device (CMOS image sensor) with column-parallel ADC in FIG. 4.

In FIG. 7, the locations surrounded by broken lines are locations where addition processing is actually performed. A thin broken line is an existing location and a thick broken line is a region according to the embodiment of the present disclosure.

The method of addition signal processing of the divided pixels that has been known is performed in the signal processing part of DSP or the like.

On the other hand, in the embodiment, as described above, addition processing is sequentially performed while AD conversion of the four divided pixel signal in the counter 152 at AD conversion.

That is, the divided pixel signals amplified within the pixel are time-sequentially sent out to the vertical signal line VSL, and AD conversion is executed by the AD converter (AD-conversion part) of the ADC group 150 provided in the column pixel signal readout part.

Then, in each ADC of the ADC group 150, when the AD-conversion operation of the second divided pixel signal is performed, the first AD-converted value is added and the AD-conversion operation of the second divided pixel signal is executed.

Then, in each ADC of the ADC group 150, when the AD-conversion operation of the third divided pixel signal is performed, the second AD-converted value is added and the AD-conversion operation of the third divided pixel signal is executed.

Then, in each ADC of the ADC group 150, when the AD-conversion operation of the fourth divided pixel signal is performed, the third AD-converted value is added and the AD-conversion operation of the fourth divided pixel signal is executed.

After the above described AD conversion period is ended, by the horizontal transfer scan circuit 130, the data held in the latches 153 are transferred to the horizontal transfer line 190, input to the signal processing circuit 180 via the amplifier circuits 170, and thereby, a two-dimensional image is generated by predetermined signal processing.

As above, the basic configuration and function in the embodiment of the present disclosure have been explained.

As below, the configurations and division forms of the pixels and divided pixels, the measures for shifts of the centers of gravity, the measures for S/N, divided pixel addition processing, etc. as characteristic configurations of the embodiment will be explained in further detail.

First, the measures for shifts of the centers of gravity and the measures for S/N as characteristic configurations of the embodiment will be described.

In the case where photosensitivity and amounts of exposure are different among the four pixels DPC-A to DPC-D of the respective pixels of RGB, the centers of gravity are different among the respective pixels, and correction of shifts of the centers of gravity may be necessary.

As shown in FIG. 2, depending on the computation when the output signal is returned to be linear as from line X to line Y, S/N may not be maximized.

Accordingly, in the embodiment, the measures for shifts of the centers of gravity and the measures for S/N described as below are taken.

<2. Measures for Shifts of Centers of Gravity>

Figure 8:
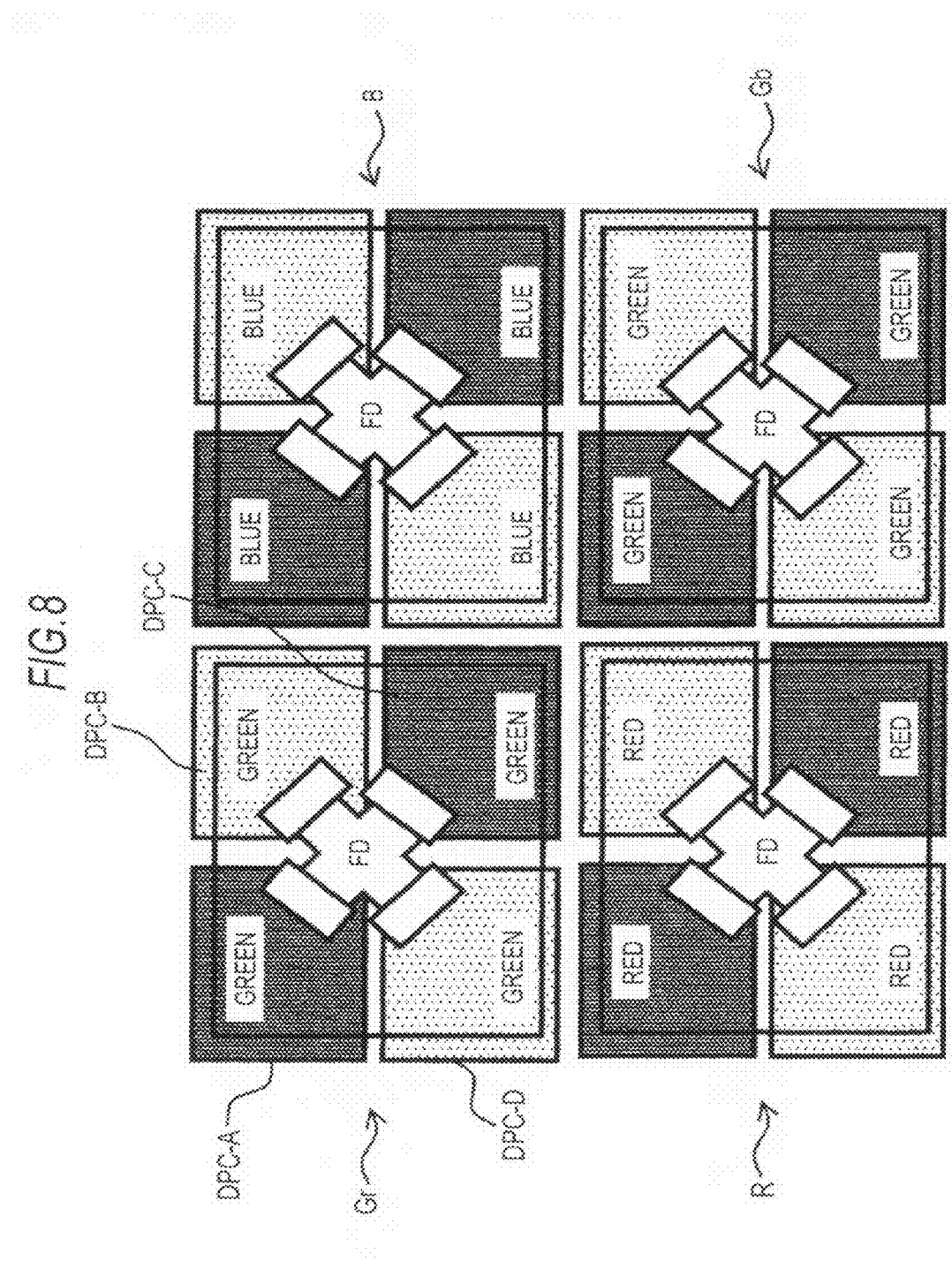
FIG. 8 is a diagram for explanation of a two-pixel diagonal method as the first measure for shifts of the centers of gravity according to the embodiment.

FIG. 8 is a diagram for explanation of a two-pixel diagonal method as the first measure for shifts of the centers of gravity according to the embodiment.

In the two-pixel diagonal method of FIG. 8, two kinds of conditions of photosensitivity/amounts of exposure are set so that the respective diagonal pixels may have the same conditions.

In the example of FIG. 8, in a Gr pixel, the first condition is such that the photosensitivity/amounts of exposure of the upper left pixel DPC-A and the lower right pixel DPC-C opposed to each other in the diagonal direction are the same. Similarly, the second condition is such that the photosensitivity/amounts of exposure of the upper right pixel DPC-B and the lower left pixel DPC-D opposed to each other in the diagonal direction are the same.

The conditions are the same with respect to other Gb pixels, R pixels, and B pixels.

Regarding these Gr pixel, Gb pixels, R pixels, and B pixels, all of the centers of gravity of the signals to be finally added in the FD are collected to the center of the four pixels, and the correction of shifts of the centers of gravity is unnecessary and strong for linear objects in the lateral direction and longitudinal direction.

Figure 9:
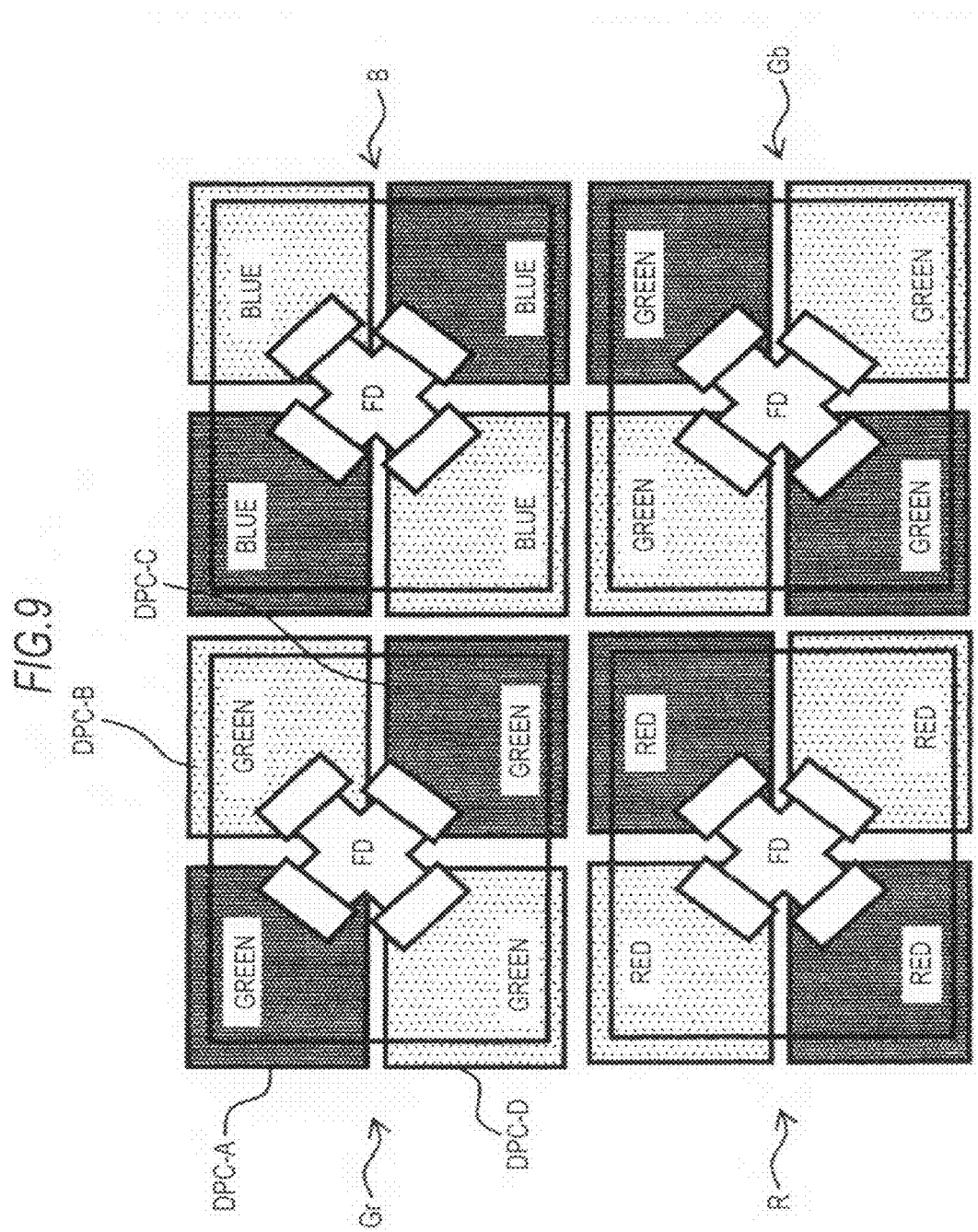
FIG. 9 is a diagram for explanation of a two-pixel diagonal Gr/Gb inversion method as the second measure for shifts of the centers of gravity according to the embodiment.

FIG. 9 is a diagram for explanation of a two-pixel diagonal Gr/Gb inversion method as the second measure for shifts of the centers of gravity according to the embodiment.

In the two-pixel diagonal Gr/Gb inversion method of FIG. 9, the direction in which the conditions of photosensitivity/amount of exposure of G pixels in the B column and the R column vary is changed.

In the example of FIG. 9, in the Gr pixel, the first condition is such that the photosensitivity/amounts of exposure of the upper left pixel DPC-A and the lower right pixel DPC-C opposed to each other in the diagonal direction are the same. In the Gr pixel, the second condition is such that the photosensitivity/amounts of exposure of the upper right pixel DPC-B and the lower left pixel DPC-D opposed to each other in the diagonal direction are the same.

In this regard, in the R pixel, the second condition is such that the photosensitivity/amounts of exposure of the upper left pixel DPC-A and the lower right pixel DPC-C opposed to each other in the diagonal direction are the same. In the R pixel, the first condition is such that the photosensitivity/amounts of exposure of the upper right pixel DPC-B and the lower left pixel DPC-D opposed to each other in the diagonal direction are the same.

Further, in the Gb pixel, the second condition is such that the photosensitivity/amounts of exposure of the upper left pixel DPC-A and the lower right pixel DPC-C opposed to each other in the diagonal direction are the same. In the Gb pixel, the first condition is such that the photosensitivity/amounts of exposure of the upper right pixel DPC-B and the lower left pixel DPC-D opposed to each other in the diagonal direction are the same.

In this regard, in the B pixel, the first condition is such that the photosensitivity/amounts of exposure of the upper left pixel DPC-A and the lower right pixel DPC-C opposed to each other in the diagonal direction are the same. In the B pixel, the second condition is such that the photosensitivity/amounts of exposure of the upper right pixel DPC-B and the lower left pixel DPC-D opposed to each other in the diagonal direction are the same.

In the two-pixel diagonal method, it is considered that the possibility of shifts of the centers of gravity may slightly remain in the linear object in the diagonal direction, however, by changing the direction in which the conditions of photosensitivity/amounts of exposure of G pixels in the B column and the R column vary, a layout having resistance in the diagonal directions may be realized.

Figure 10:
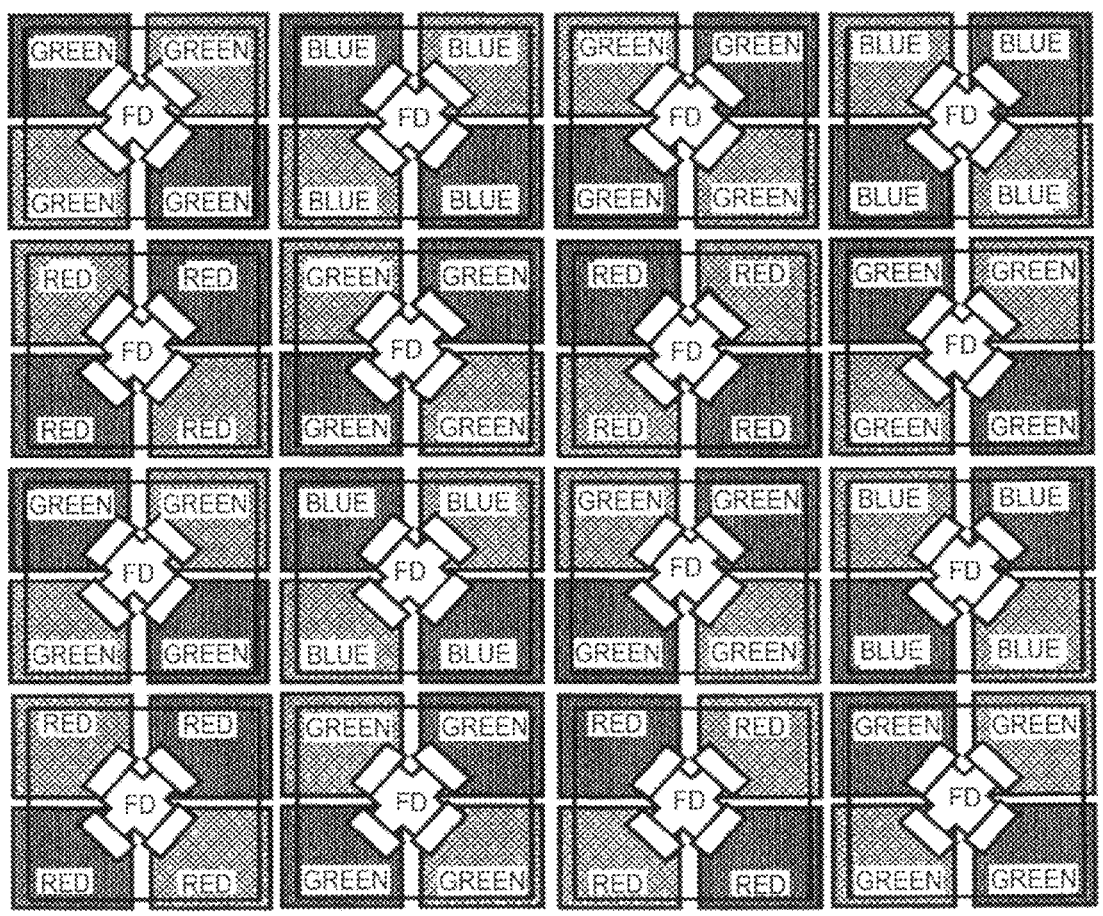
FIG. 10 is a diagram for explanation of an application example of the two-pixel diagonal Gr/Gb inversion method as the second measure for shifts of the centers of gravity according to the embodiment.

Note that arrangements strong for false color and noise can be made with respect to the B signals and R signals by further applying the two-pixel diagonal Gr/Gb inversion method with a little ingenuity of arrangement in units of pixels of 8×8 as shown in FIG. 10.

<3. Measures for S/N>

Figure 11:
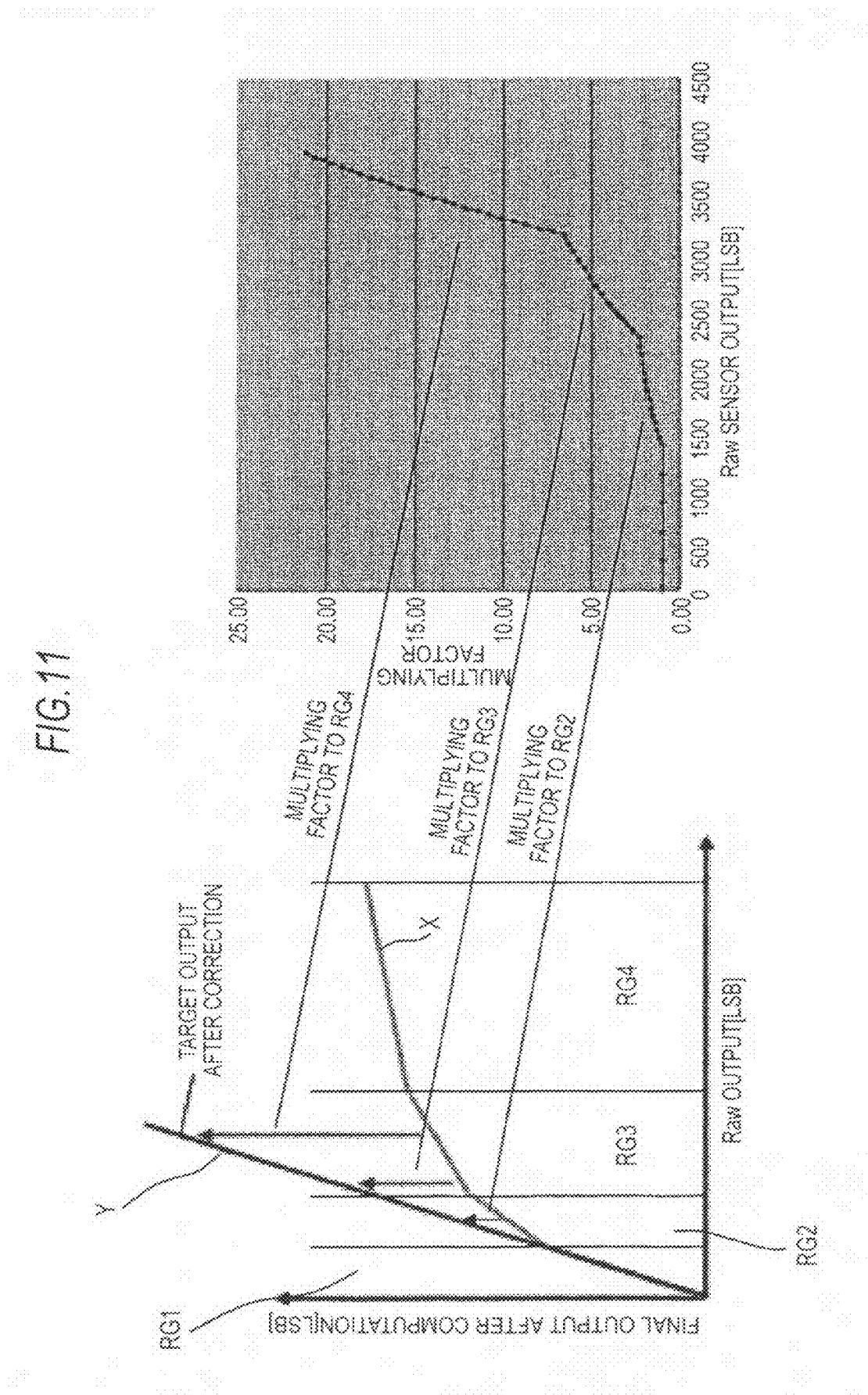
FIG. 11 is a diagram for explanation of measures for S/N according to the embodiment.

FIG. 11 is a diagram for explanation of measures for S/N according to the embodiment.

In FIG. 11, to facilitate understanding, the signs are the same as those in FIG. 2 and FIG. 2 may be cited in the explanation.

As explained with reference to FIG. 2, subtraction of the intercept of the expression is subtraction of Signal, and deterioration of S/N may be caused.

That is, in the existing method, to obtain the target output from the Raw sensor output, computation is performed directly from the equation. Accordingly, S/N may be deteriorated due to the influence of the subtraction component (only on Signal) and the multiplication component (also on Noise).

On the other hand, in the embodiment, to prevent S/N deterioration, "multiplying factor for obtaining target value" is once obtained from the obtained signal value and computation is performed by "obtained signal value×multiplying factor", and thereby, the intercept (Signal) may be left.

That is, the multiplying factor is calculated from the Raw sensor output.

By directly multiplying the Raw sensor output by the multiplying factor (without subtraction), S/N may be maintained.

As described above, "measures for S/N" in the embodiment is a method of computing the signal value after readout of the pixel signal, and the multiplying factor is changed depending on the obtained signal value and output.

As a computation method, for example, there is a method having multiplying factor tables with respect to each output value or a method of mathematical computation.

These computations are performed in one system after readout of the pixel signal. For example, the processing may be performed in the signal processing circuit 180.

<4. Configuration Example of Divided Pixel>

First, to facilitate understanding, an example of a configuration of a basic divided pixel of the CMOS image sensor will be explained.

Figure 12:
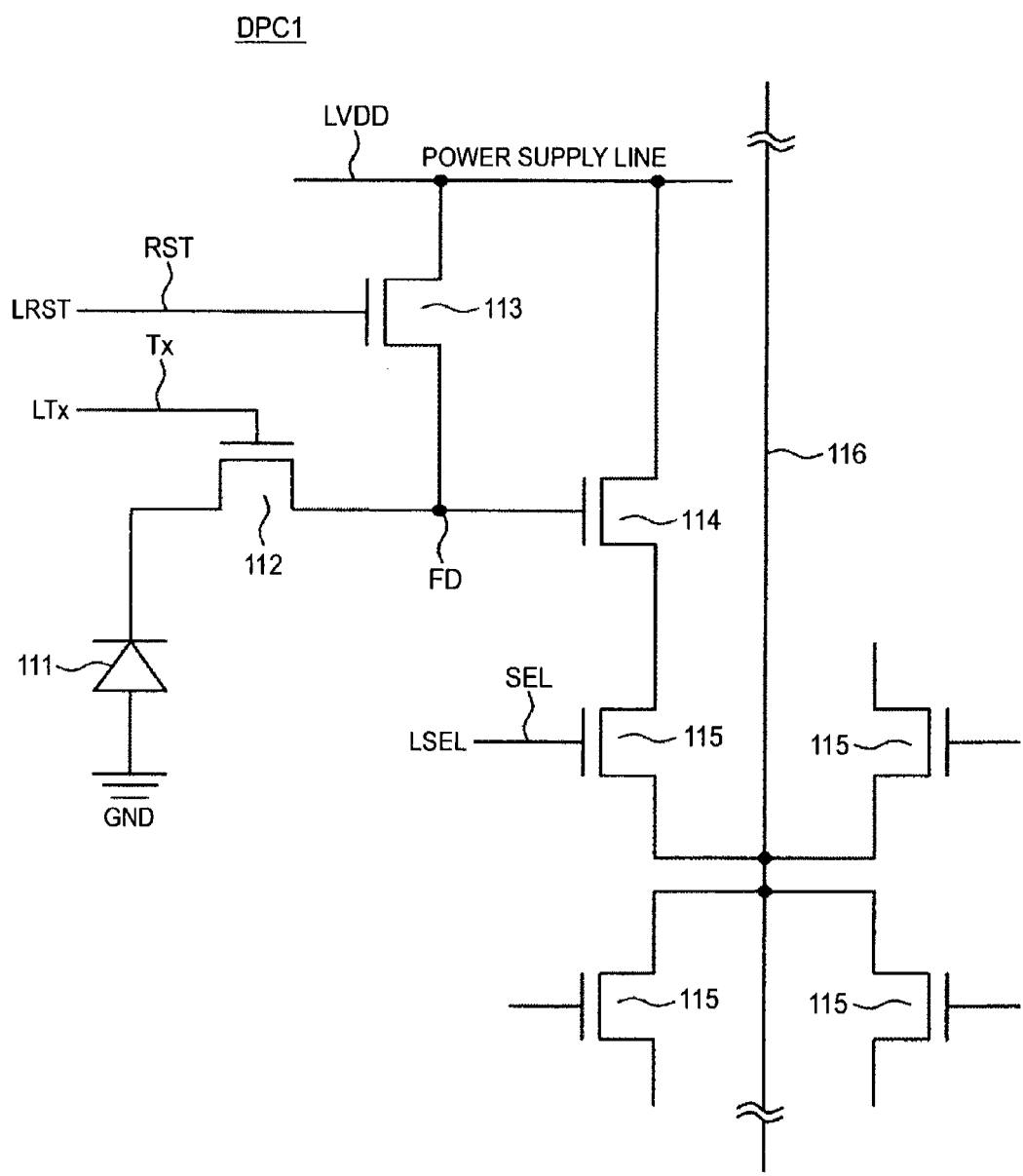
FIG. 12 is a diagram showing an example of a divided pixel of the CMOS image sensor including four transistors according to the embodiment.

FIG. 12 is a diagram showing an example of a divided pixel of the CMOS image sensor including four transistors according to the embodiment.

The divided pixel DPC1 has a photoelectric conversion element 111 formed by a photodiode, for example.

The divided pixel DPC in FIG. 12 has four transistors of a transfer transistor 112, a reset transistor 113, an amplifying transistor 114 as an amplification part, and a selection transistor 115 as active elements for the one photoelectric conversion element 111.

The photoelectric conversion element 111 photoelectrically converts incident light into charge (here, electrons) in an amount in response to the amount of light.

The transfer transistor 112 is connected between the photoelectric conversion element 111 and the floating diffusion part FD and a control signal Tx is provided to its gate (transfer gate) through a transfer control line LTx.

Thereby, the electrons photoelectrically converted by the photoelectric conversion element 111 are transferred to the floating diffusion part FD.

The reset transistor 113 is connected between a power supply line LVDD and the floating diffusion part FD and a control signal RST is provided to its gate through a reset control line LRST.

Thereby, the potential of the floating diffusion part FD is reset to the potential of the power supply line LVDD.

To the floating diffusion part FD, the gate of the amplifying transistor 114 is connected. The amplifying transistor 114 is connected to a vertical signal line 116 via the selection transistor 115 and forms a source follower with a constant current source outside of the pixel part.

Further, a control signal (address signal or select signal) SEL is provided to the gate of the selection transistor 115 through a selection control line LSEL and the selection transistor 115 is turned on.

When the selection transistor 115 is turned on, the amplifying transistor 114 amplifies the potential of the floating diffusion part FD and outputs a voltage in response to the potential to the vertical signal line 116. The voltages output from the respective pixels through the vertical signal line 116 are output to the ADC group 150 as the pixel signal readout circuit.

These operations are simultaneously performed with respect to the respective divided pixels DPC of one row because, for example, the respective gates of the transfer transistors 112, the reset transistors 113, and the selection transistors 115 are connected in units of rows.

The reset control line LRST, the transfer control line LTx, and the selection control line LSEL wired in the pixel part 110 are wired as one set for the respective rows of the pixel arrangement.

These reset control line LRST, transfer control line LTx, and selection control line LSEL are driven by the pixel drive circuit 102.

The above described configuration can be applied without change to the divided pixel cell according to the embodiment.

Further, as a configuration in which each divided pixel cell contains the photoelectric conversion element and the transfer transistor, a configuration in which the divided pixel cells share the floating diffusion part FD can be employed.

In this case, the cells can be formed to share the amplifying transistor as the amplification part, the selection transistor, and the reset transistor.

Figure 13:
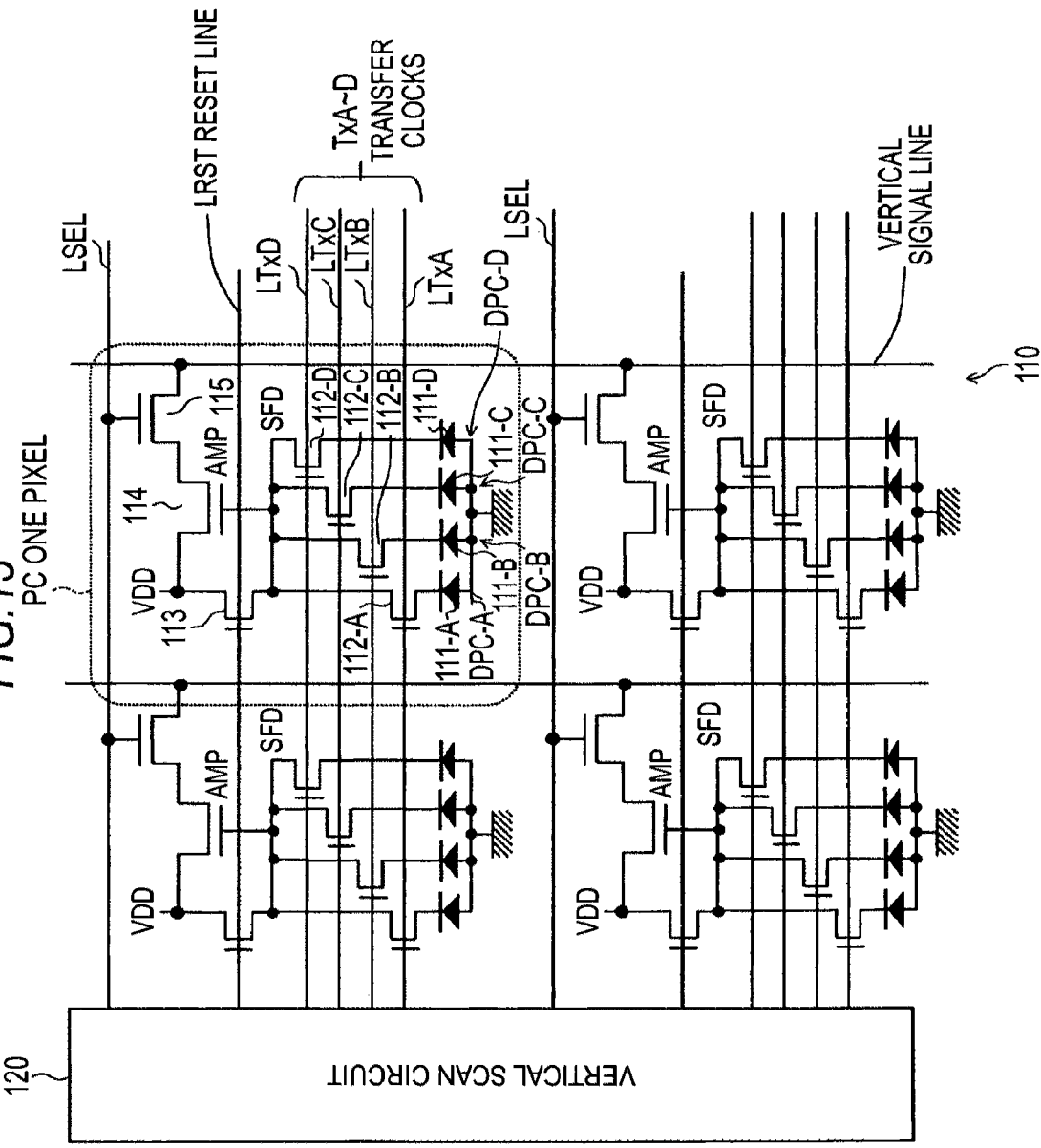
FIG. 13 is a circuit diagram showing an example of the plural divided pixels sharing floating diffusion parts, amplifying transistors, selection transistors, reset transistors.

FIG. 13 is a circuit diagram showing an example of the plural divided pixels sharing floating diffusion parts, amplifying transistors, selection transistors, reset transistors.

For the pixel PC containing plural divided pixels DPC-A to DPC-D in FIG. 13, the photoelectric conversion elements 111-A to 111-D and transfer transistors 112-A to 112-D are provided with respect to the divided pixels DPC-A to DPC-D.

Further, one ends (for example, drains) of the transfer transistors 112-A to 112-D are connected to a shared floating diffusion part SFD.

The gate of the transfer transistor 112-A is connected to a transfer control line LTxA and the gate of the transfer transistor 112-B is connected to a transfer control line LTxB. Similarly, the gate of the transfer transistor 112-C is connected to a transfer control line LTxC and the gate of the transfer transistor 112-D is connected to a transfer control line LTxD.

The reset transistor 113 is connected between the power supply potential VDD and the shared floating diffusion part SFD. The gate of the reset transistor 113 is connected to the reset control line LRST.

The amplifying transistor 114 and the selection transistor 115 are connected in series between the power supply potential VDD and the vertical signal line 116. Further, the gate of the amplifying transistor 114 is connected to the shared floating diffusion part SFD and the gate of the selection transistor 115 is connected to the selection control line LSEL.

In the configuration, the divided pixel signals photoelectrically converted by the photoelectric conversion elements 111-A to 111-D of the respective divided pixels DPC-A to DPC-D are transferred to the amplifying transistor 114 as the amplification part through the shared floating diffusion part SFD. Then, the divided pixel signals are amplified and the amplified divided pixel signals are time-sequentially sent out to the vertical signal line 116.

Further, a configuration in which each divided pixel cell contains the photoelectric conversion element, the transfer transistor, and the reset transistor and the divided pixel cell individually contains the floating diffusion part FD can be employed.

In this case, the cells can be formed to share the amplifying transistor as the amplification part.

Figure 14:
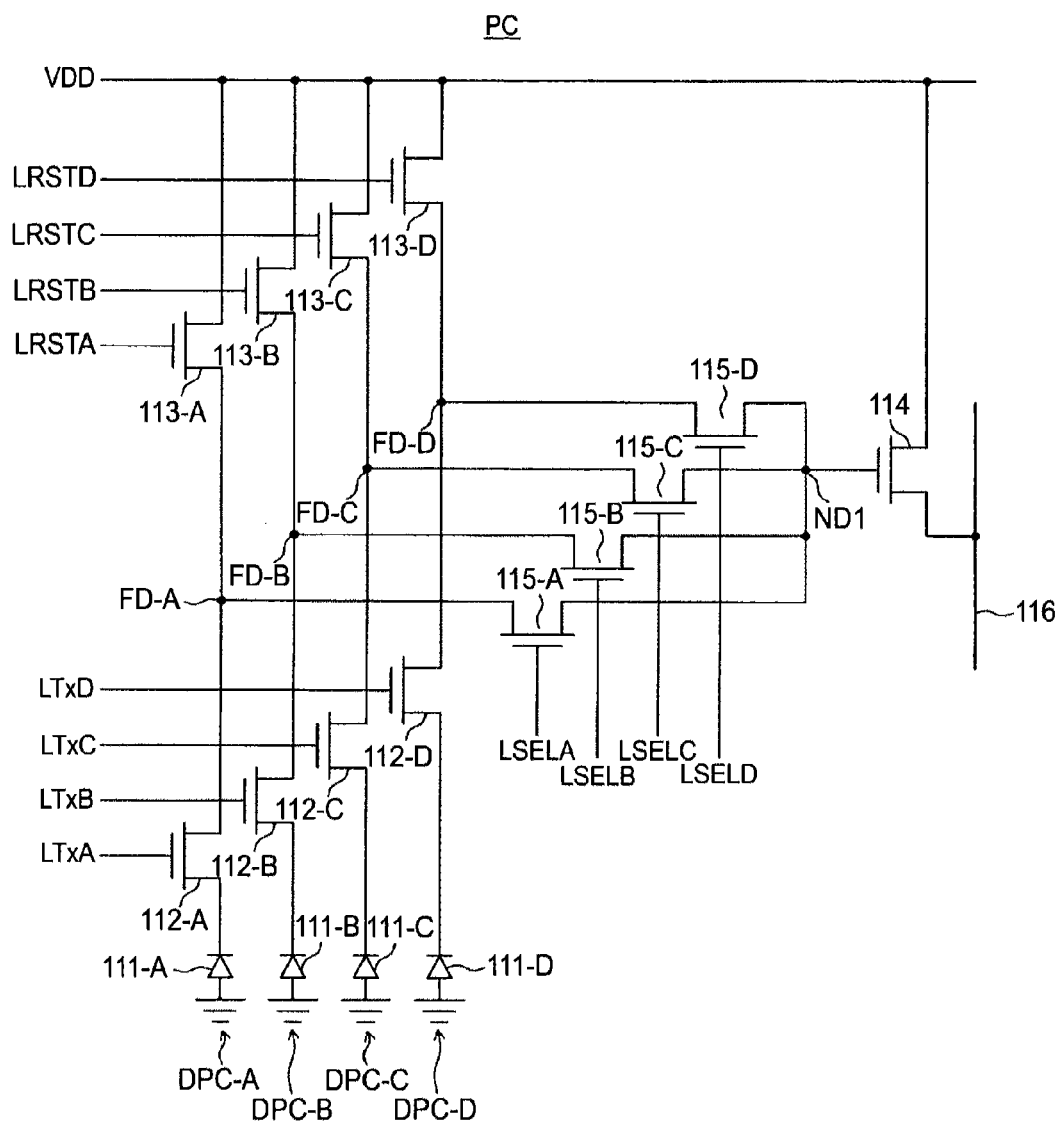
FIG. 14 is a circuit diagram showing an example of the plural divided pixels individually having floating diffusion parts and sharing an amplifying transistors.

FIG. 14 is a circuit diagram showing an example of the plural divided pixels individually having floating diffusion parts and sharing amplifying transistors.

In the pixel PC containing the plural divided pixels DPC-A to DPC-D of FIG. 14, the photoelectric conversion elements 111-A to 111-D and transfer transistors 112-A to 112-D are provided with respect to the divided pixels DPC-A to DPC-D. Further, in the divided pixels DPC-A to DPC-D, floating diffusion parts FD-A to FD-D and reset transistors 113-A to 113-D are provided.

The selection transistor 115-A is connected between the floating diffusion part FD-A and a node ND1, and the selection transistor 115-B is connected between the floating diffusion part FD-B and the node ND1.

Similarly, the selection transistor 115-C is connected between the floating diffusion part FD-C and the node ND1, and the selection transistor 115-D is connected between the floating diffusion part FD-D and the node ND1.

The gate of the transfer transistor 112-A is connected to the transfer control line LTxA and the gate of the transfer transistor 112-B is connected to the transfer control line LTxB. Similarly, the gate of the transfer transistor 112-C is connected to the transfer control line LTxC and the gate of the transfer transistor 112-D is connected to the transfer control line LTxD.

The gate of the reset transistor 113-A is connected to the reset control line LRSTA and the gate of the reset transistor 113-B is connected to the reset control line LRSTB. Similarly, the gate of the reset transistor 113-C is connected to the reset control line LRSTC and the gate of the reset transistor 113-D is connected to the reset control line LRSTD.

The gate of the selection transistor 115-A is connected to the selection control line LSELA and the gate of the selection transistor 115-B is connected to the selection control line LSELB. Similarly, the gate of the selection transistor 115-C is connected to the selection control line LSELC and the gate of the selection transistor 115-D is connected to the selection control line LSELD.

The amplifying transistor 114 is connected between the power supply potential VDD and the vertical signal line 116. Further, the gate of the amplifying transistor 114 is connected to the node ND1.

In the configuration, the divided pixel signals photoelectrically converted by the photoelectric conversion elements 111-A to 111-D of the respective divided pixels DPC-A to DPC-D are transferred to the floating diffusion parts FD-A to FD-D. The divided pixel signals are transferred to the amplifying transistor 114 as the amplification part through the floating diffusion parts FD-A to FD-D and further via the selection transistors 115-A to 115-D. Then, the divided pixel signals are amplified and the amplified divided pixel signals are time-sequentially sent out to the vertical signal line 116.

Further, a configuration in which plural divided pixels forming one pixel are divided into plural groups and each divided group shares the floating diffusion part FD can be employed.

In this case, each divided group can be formed to share the reset transistor and the selection transistor and the groups can be formed to share the amplifying transistor as a whole.

Figure 15:
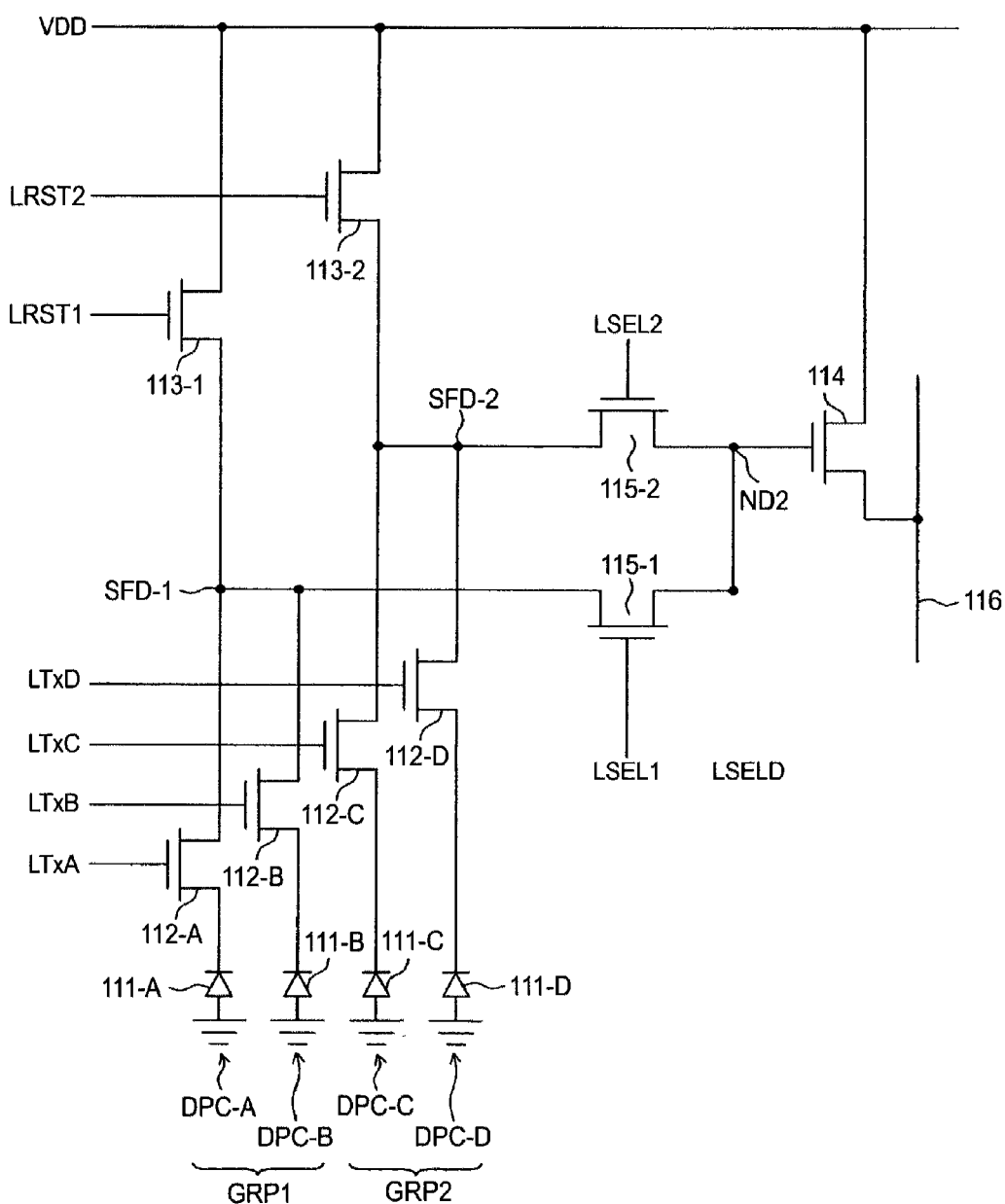
FIG. 15 is a circuit diagram showing an example of plural divided pixels grouped and sharing floating diffusion parts in the respective groups and sharing an amplifying transistor in the pixels as a whole.

FIG. 15 is a circuit diagram showing an example of plural divided pixels grouped and sharing floating diffusion parts in the respective groups and sharing an amplifying transistors in the pixel as a whole.

In this example, four divided pixels DPC-A, DPC-B, DPC-C, DPC-D are segmented into two groups.

Specifically, the divided pixel DPC-A and the divided pixel DPC-B are segmented into the first group GRP1 and the divided pixel DPC-C and the divided pixel DPC-D are segmented into the second group GRP2.

For the divided pixels DPC-A and DPC-B of the first group GRP1 in FIG. 15, the photoelectric conversion elements 111-A and 111-B and the transfer transistors 112-A and 112-B are provided, respectively.

Further, one ends (for example, drains) of the transfer transistors 112-A and 112-B are connected to a shared floating diffusion part SFD1.

The gate of the transfer transistor 112-A is connected to the transfer control line LTxA and the gate of the transfer transistor 112-B is connected to the transfer control line LTxB.

For the divided pixels DPC-C and DPC-D of the second group GRP2 in FIG. 15, the photoelectric conversion elements 111-C and 111-D and the transfer transistors 112-C and 112-D are provided, respectively.

Further, one ends (for example, drains) of the transfer transistors 112-C and 112-D are connected to a shared floating diffusion part SFD2.

The gate of the transfer transistor 112-C is connected to the transfer control line LTxC and the gate of the transfer transistor 112-D is connected to the transfer control line LTxD.

A reset transistor 113-1 is connected between the power supply potential VDD and a shared floating diffusion part SFD1. The gate of the reset transistor 113-1 is connected to the reset control line LRST1.

A reset transistor 113-2 is connected between the power supply potential VDD and the shared floating diffusion part SFD2. The gate of the reset transistor 113-2 is connected to a reset control line LRST2.

A selection transistor 115-1 is connected between the shared floating diffusion part SFD1 and the node ND2 and a selection transistor 115-2 is connected between the shared floating diffusion part SFD2 and the node ND2.

The gate of the selection transistor 115-1 is connected to a selection control line LSEL1 and the gate of the selection transistor 115-2 is connected to a selection control line LSEL2.

The amplifying transistor 114 is connected between the power supply potential VDD and the vertical signal line 116. Further, the gate of the amplifying transistor 114 is connected to the node ND2.

In the configuration, the divided pixel signals photoelectrically converted by the photoelectric conversion elements 111-A to 111-D of the respective divided pixels DPC-A to DPC-D are transferred to the shared floating diffusion parts SFD1 and SFD2. The divided pixel signals are transferred to the amplifying transistor 114 as the amplification part through the shared floating diffusion parts SFD1 and SFD2 and further via the selection transistors 115-1 and 115-2. Then, the divided pixel signals are amplified and the amplified divided pixel signals are time-sequentially sent out to the vertical signal line 116.

As described above, there are various methods of division into plural regions within a surface of one pixel, and the methods are roughly classified into a shared floating diffusion (four pixels shared) method (hereinafter, referred to as "shared FD method") and an individual floating diffusion method (hereinafter, referred to as "individual FD method").

FIGS. 16A to 16D are diagrams for explanation of methods of division into plural regions within a surface of one pixel.

Figure 16A:
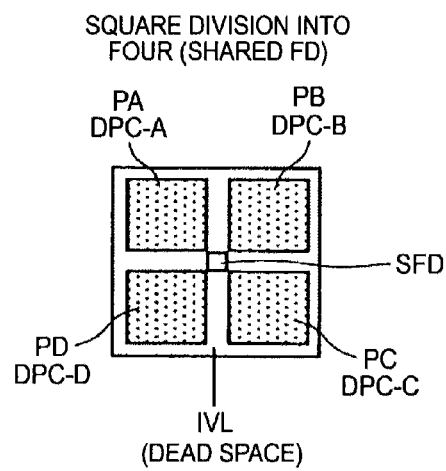
FIGS. 16A to 16D are diagrams for explanation of methods of division into plural regions within a surface of one pixel.
Figure 16B:
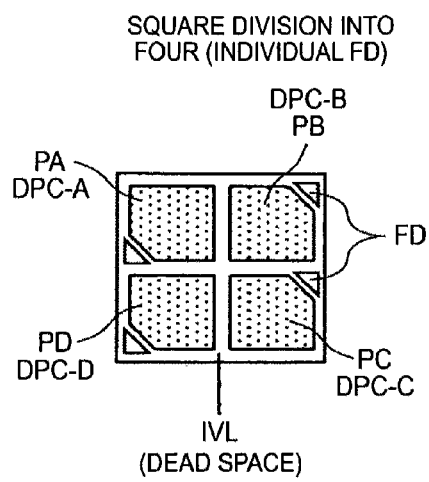
Figure 16C:
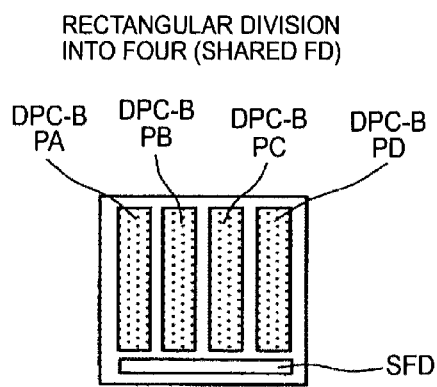
Figure 16D:
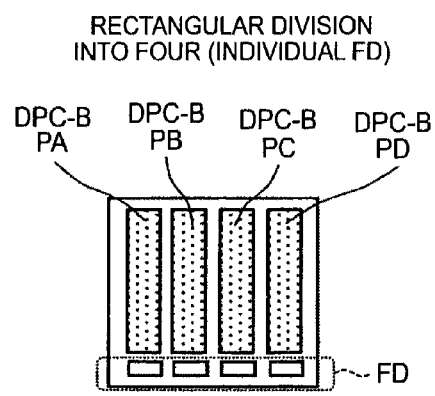

FIG. 16A shows an example of division into four in square shapes by the shared FD method, FIG. 16B shows an example of division into four in square shapes by the individual FD method, FIG. 16C shows an example of division into four in reed shapes by the shared FD method, and FIG. 16D shows an example of division into four in reed shapes by the individual FD method.

Although the detailed explanation is omitted, stacking of photosensitive layers and semiconductor layers (P-N junction) with different sensitivity in a direction perpendicular to the surface may be referred to as pixel division in a broad sense.

To change the sensitivity of the divided pixel may be realized by methods of changing the aperture ratio of the device, providing optical filter characteristics to the insulating film on the photosensitive region, changing impurity concentration of the substrate, etc.

FIGS. 16A to 16D show specific examples in which one pixel is divided into four, and there are ineffective regions (dead spaces) IVL that does not directly contribute to photosensitivity in addition to divided photosensitive regions PA, PB, PC, PD.

The region IVL is a space (channel stop) for electric isolation so that the pixel charge accumulated in the divided cells may not leak out or interfere with each other, and wiring for signal processing is provided therein according to need.

In the above explanation, the divided pixel addition signal processing has been explained by taking the solid-state image sensing device (CMOS image sensor) with column-parallel ADC as an example.

For the divided pixel addition signal processing of the column AD conversion type CMOS image sensor, for example, the following two methods can be employed.

Figure 17A:
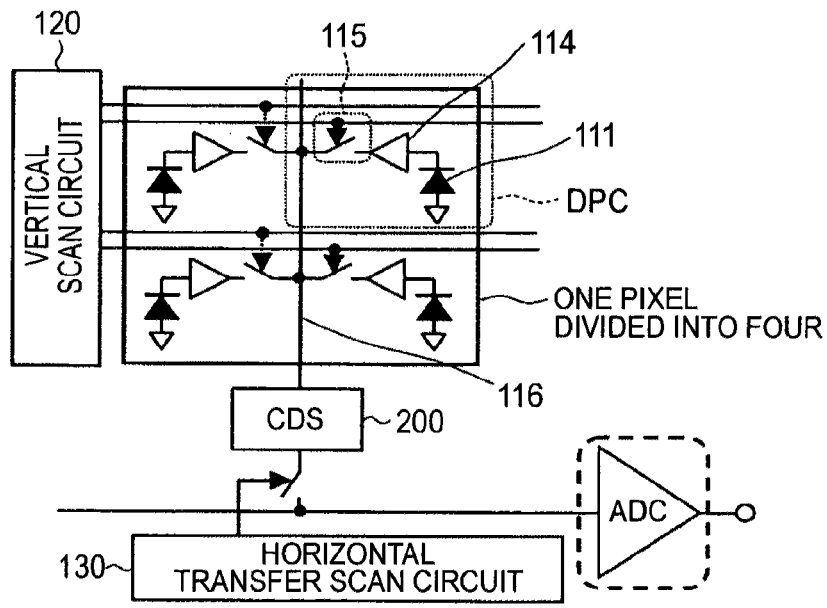
FIGS. 17A and 17B are diagrams schematically showing configuration examples of column AD conversion type CMOS image sensor circuits related to divided pixel addition.

FIG. 17A is a diagram schematically showing a configuration example of a column AD conversion type CMOS image sensor circuit related to divided pixel addition.

In FIG. 17A, one pixel under color filters of the same color is divided into four and photosensitivity and accumulation times are varied with respect to each of the plural pixels opposed in the diagonal direction of the respective divided pixels, and pixel signals are sequentially read out to the same signal line through the shared floating diffusion part FD. Then, noise processing is performed by a CDS circuit 200 provided with respect to each column and A/D conversion is performed on one row at a time outside of the column.

Figure 17B:
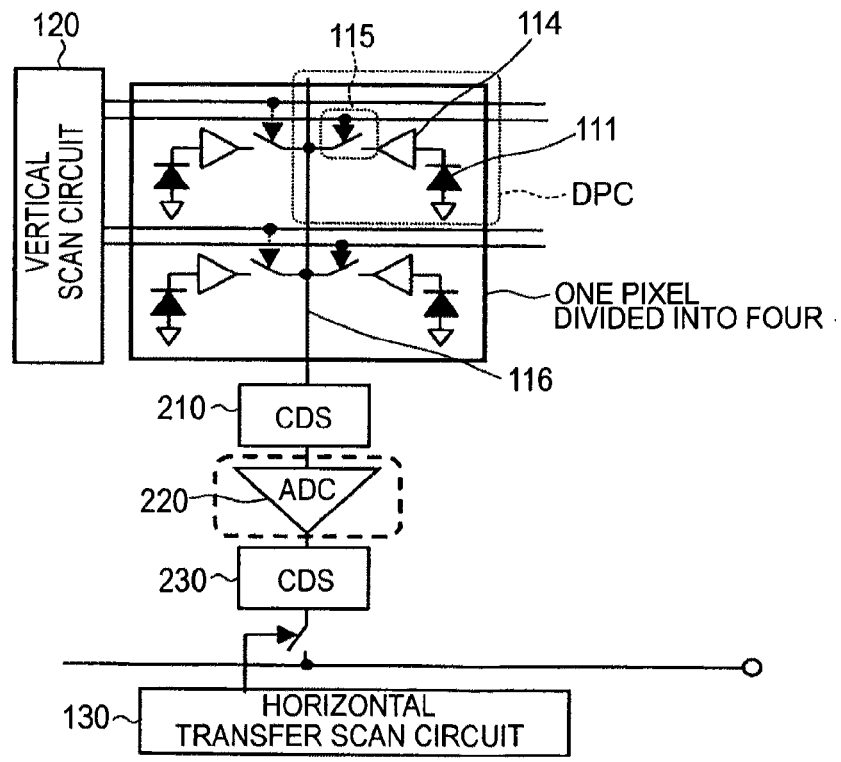

FIG. 17B is a diagram schematically showing another configuration example of the column AD conversion type CMOS image sensor circuit related to divided pixel addition.

In FIG. 17B, one pixel under color filters of the same color is divided into four and photosensitivity and accumulation times are varied with respect to each of the plural pixels opposed in the diagonal direction of the respective divided pixels. Then, pixel signals are sequentially read out to the same signal line through the shared FD, and the first noise processing is performed by a CDS circuit 210 provided with respect to each column.

Then, the analog signal is converted into a digital signal by an A/D converter 220 similarly provided with respect to each column, the second noise processing is performed by a CDS circuit 230 similarly provided with respect to each column, and thereby, the digital noise generated at A/D conversion is removed.

Further, in the above explanation, the example in which the embodiment of the present disclosure is applied to the CMOS image sensor has been explained, however, the embodiment of the present disclosure may be applied to a CCD sensor.

FIG. 18 is a diagram showing a configuration example of a solid-state image sensing device corresponding to a CCD sensor according to the embodiment of the present disclosure.

A solid-state image sensing device 300 in FIG. 18 has plural sensor parts (photoelectric conversion elements) 311 arranged in a matrix in the row (vertical) direction and the column (horizontal) direction and convert incident light into signal charge in an amount of charge in response to its amount of light and accumulates it.

The solid-state image sensing device 300 has plural vertical transfer registers 312 arranged with respect to each vertical column of the sensor parts 311 and vertically transfer signal charge read out via a readout gate part (not shown) from the respective sensor parts 311. The sensor parts and the vertical transfer registers 312 form an imaging area 313.

The sensor part 311 employs Bayer arrangement and the respective pixels are divided into divided pixels DPC as plural regions with different sensitivity (for example, four, two for each).

The vertical transfer register 312 is driven for transfer by vertical transfer pulses for three or four phases, for example, and sequentially transfers signal charge as divided pixel signals read out from the respective sensor parts 311 with respect to each part corresponding to one scan line (one line) in a part of a horizontal blanking period.

A horizontal transfer register 314 is provided on the lower side of the imaging area 313 in the drawing. The signal charge as divided pixel signals corresponding to one line is sequentially transferred from each of the plural vertical transfer registers 312 to the horizontal transfer register 314.

The horizontal transfer register 314 is driven for transfer by vertical transfer pulses for three or four phases, for example, and sequentially transfers the signal charge for one line transferred from the plural vertical transfer registers 312 in the horizontal direction in a horizontal scan period after the horizontal blanking period.

At the end on the transfer destination side of the horizontal transfer register 314, for example, a charge detection part 315 having a floating diffusion amplifier configuration is provided.

The charge detection part 315 has a floating diffusion part FD that accumulates signal charge supplied from the horizontal transfer register 314 via a horizontal output gate part. Though not shown, the charge detection part 315 includes a reset drain (RD) that drains signal charge and a reset gate (RG) provided between the floating diffusion part FD and the reset drain.

In the charge detection part 315, a predetermined reset drain voltage is applied to the reset drain and reset pulses are applied to the reset gate with a detection period of signal charge.

Further, the signal charge accumulated in the floating diffusion part FD is converted into a signal voltage and led out to a CSD circuit 320 via an output circuit 316 as a CCD output signal CCDout. Then, in an ADC 330, AD conversion and addition processing of the respective divided pixel signals are performed.

As explained above, according to the embodiment, for prevention of shifts of the centers of gravity, a structure under two conditions of exposure time conditions (or photosensitivity) with pixels opposed to each other in the diagonal direction having the same exposure time (or photosensitivity) is employed.

Further, these pixel signals are sent out to the vertical signal line and added in the AD conversion part provided in the column part.

Furthermore, in the embodiment, to maximize S/N, a configuration in which, when the signal is returned to be linear, the signal is not directly obtained by computation, but the final output is obtained by once calculating an optimal multiplying factor from a raw (Raw) output value and multiplying the raw (Raw) output value by the multiplying factor is employed.

Therefore, according to the embodiment, the following advantages may be obtained:

Shifts of the centers of gravity can be prevented and S/N can be maximized.

Pixels of a solid-state image sensing device that has a wide dynamic range, higher sensitivity with a low amount of light, and a high-brightness information compression property may be realized.

Further, an external memory is unnecessary compared to existing digital addition.

There are no longer variations of the break point at which one of pixels as addition targets is saturated as in analog addition.

S/N is improved at the break point (at which one of pixels as addition targets is saturated) and S/N nearly equal to or more than that of a non-divided pixel may be achieved in the middle or higher brightness range.

Furthermore, a divided pixel structure may be realized without much increase in the number of processes.

In addition, a configuration in which the respective divided pixels are independently read out according to the specifications and the readout may be switched to readout for obtaining high resolution images can be employed.

The solid-state image sensing device having the above advantages may be applied as an imaging device for a digital camera or video camera.

<5. Configuration Example of Camera System>

Figure 19:
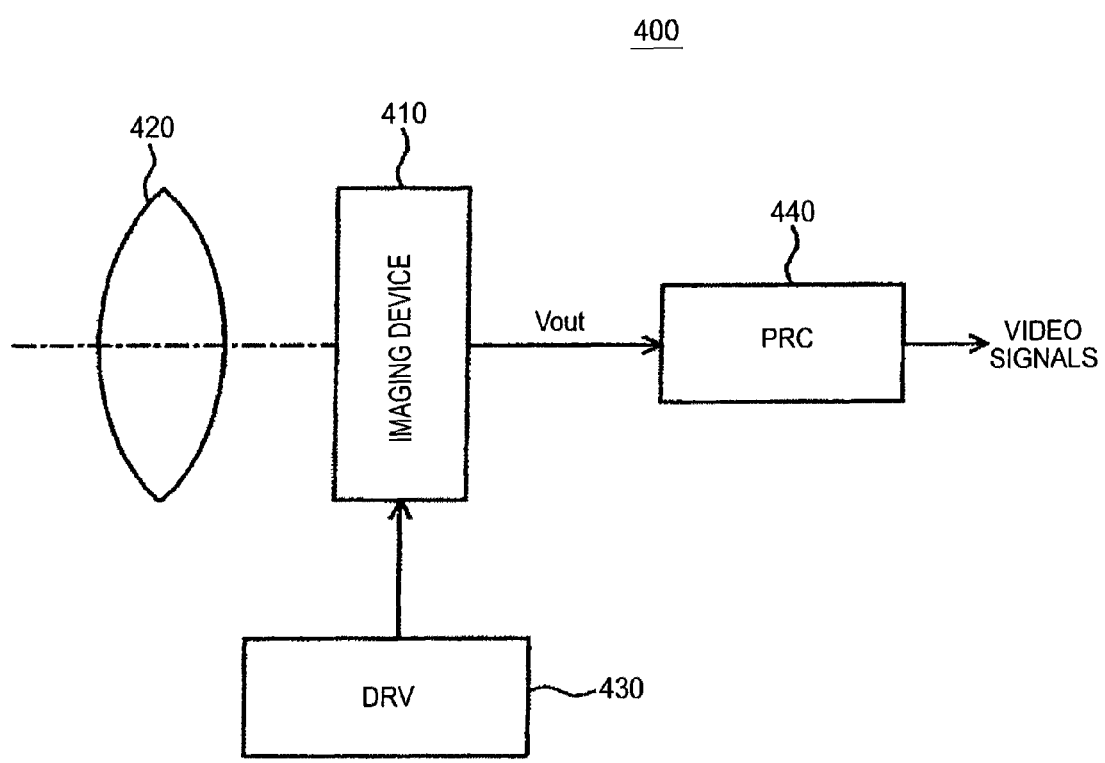
FIG. 19 is a diagram showing an example of a configuration of a camera system to which the solid-state image sensing device according to the embodiment of the present disclosure is applied.

FIG. 19 is a diagram showing an example of a configuration of a camera system to which the solid-state image sensing device according to the embodiment of the present disclosure is applied.

The camera system 400 has an imaging device 410 to which the CMOS image sensor (solid-state image sensing device) 100, 300 according to the embodiment can be applied as shown in FIG. 19.

The camera system 400 has an optical system that guides incident light to a pixel region of the imaging device 410 (forms an object image) and a lens 420 that images the incident light (image light) on an imaging surface, for example.

The camera system 400 has a drive circuit (DRV) 430 that drives the imaging device 410 and a signal processing circuit (PRC) 440 that processes an output signal of the imaging device 410.

The drive circuit 430 has a timing generator (not shown) that generates various timing signals including start pulses and clock pulses that drive the circuits within the imaging device 410, and drives the imaging device 410 with predetermined timing signals.

Further, the signal processing circuit 440 performs signal processing such as CDS on the output signal of the imaging device 410.

The image signal processed in the signal processing circuit 440 is recorded in a recording medium such as a memory. The image information recorded in the recording medium is hard-copied using a printer or the like. Alternatively, the image signal processed in the signal processing circuit 440 is displayed as a moving image on a monitor of a liquid crystal display or the like.

As described above, in an imaging apparatus such as a digital camera, by mounting the above described image sensing device 100 as the imaging device 410, a camera with low power consumption and high definition may be realized.

The present disclosure contains subject matter related to that disclosed in Japanese Priority Patent Application JP 2010-250328 filed in the Japan Patent Office on Nov. 8, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image sensing device comprising:
a pixel part in which plural pixels are arranged in a matrix; and
a pixel signal readout part including an AD conversion part that analog-digital (AD)-converts pixel signals read out from the pixel part,
wherein each of plural adjacent pixels or individual pixels of the pixel part are respectively constituted as plural divided pixels that are divided into regions with different photosensitivity or amounts of accumulated charge,
plural photosensitivity or exposure time conditions are respectively set for the plural divided pixels, with the photosensitivity or exposure time conditions of the divided pixels that are opposed in diagonal directions being set to the same conditions,
the pixel signal readout part reads out divided pixel signals respectively corresponding to the divided pixels, and
the AD conversion part obtains a given pixel signal of a given pixel by AD-converting and adding respective ones of the divided pixel signals that correspond to the given pixel.

2. The solid-state image sensing device according to claim 1, further comprising a processing part that obtains a final output by obtaining an optimal multiplying factor from an output value of the pixel signal readout part and multiplying the output value by the obtained multiplying factor.

3. The solid-state image sensing device according to claim 1, wherein a pixel signal that is readout part time-sequentially includes reading out the divided pixel signals of the respective divided pixels to a signal line, wherein
the AD conversion part sequentially performs processing of AD-converting the divided pixel signal input through the signal line and, at AD-conversion of the next divided pixel signal, adding the previous AD-converted value and AD-converting the next divided pixel signal.

4. The solid-state image sensing device according to claim 3, wherein an individual pixel having plural divided pixels includes:
plural photoelectric conversion elements provided with respect to each divided pixel;
a shared floating diffusion part formed in common among the respective divided pixels; and
an amplification part formed in common among the respective divided pixels, and
the pixel signal readout part transfers the divided pixel signals photoelectrically converted by the photoelectric conversion elements of the respective divided pixels to the amplification part through the shared floating diffusion part and amplifies the signals, and time-sequentially sends out the amplified divided pixel signals to the signal line.

5. The solid-state image sensing device according to claim 3, wherein an individual pixel having plural divided pixels includes:
plural photoelectric conversion elements provided with respect to each divided pixel;
plural floating diffusion parts provided with respect to each divided pixel; and
an amplification part formed in common among the respective divided pixels, and the pixel signal readout part transfers the divided pixel signals photoelectrically converted by the photoelectric conversion elements of the respective divided pixels to the amplification part through the floating diffusion parts and amplifies the signals, and time-sequentially sends out the amplified divided pixel signals to the signal line.

6. The solid-state image sensing device according to claim 3, wherein an individual pixel having plural divided pixels is segmented into plural groups and includes:
   plural photoelectric conversion elements provided with respect to each divided pixel;
   plural shared floating diffusion parts formed in common among the groups of the respective divided pixels; and
   an amplification part formed in common among the respective groups, and
   the pixel signal readout part transfers the divided pixel signals photoelectrically converted by the photoelectric conversion elements of the respective divided pixels to the amplification part through the shared floating diffusion parts corresponding to the groups and amplifies the signals, and time-sequentially sends out the amplified divided pixel signals to the signal line.

7. The solid-state image sensing device according to claim 3, wherein an individual pixel having plural divided pixels includes:
   plural photoelectric conversion elements provided with respect to each divided pixel;
   plural floating diffusion parts provided with respect to each divided pixel; and
   amplification parts provided with respect to each divided pixel, and
   the pixel signal readout part transfers the divided pixel signals photoelectrically converted by the photoelectric conversion elements of the respective divided pixels to the amplification parts through the floating diffusion parts and amplifies the signals, and time-sequentially sends out the amplified divided pixel signals to the signal line.

8. The solid-state image sensing device according to claim 3, wherein an individual pixel having plural divided pixels includes:
   plural photoelectric conversion elements provided with respect to each divided pixel; and
   plural floating diffusion parts provided with respect to each divided pixel,
   the pixel signal readout part includes an amplification part, and respectively sends out the divided pixel signals photoelectrically converted by the photoelectric conversion elements of the respective divided pixels to different signal lines through the respective floating diffusion parts in parallel, and
   the AD conversion part obtains a whole pixel signal by AD-converting the plural divided pixel signals amplified in the amplification part in parallel and sequentially adding the AD-converted values at plural times.

9. The solid-state image sensing device according to claim 8, wherein the AD conversion part obtains the whole pixel signal by stopping AD conversion processing at times when the plural amplified divided pixel signals are respectively saturated and sequentially adding the AD-converted values at plural times.

10. The solid-state image sensing device according to claim 3, wherein an individual pixel having plural divided pixels includes plural photoelectric conversion elements provided with respect to each divided pixel,
    the pixel signal readout part includes:
    a first transfer register that transfers the divided pixel signals in a column direction;
    a second transfer register that transfers the divided pixel signals in a direction orthogonal to the transfer direction of the first transfer register; and
    a floating diffusion part to which the divided pixel signals transferred through the second transfer register are supplied, and
    the pixel signal readout part time-sequentially sends out the divided pixel signals photoelectrically converted by the photoelectric conversion elements of the respective divided pixels to the first transfer register and the second transfer register, amplifies the signals through the floating diffusion part, performs correlated double sampling processing thereon, and performs the AD conversion thereon in the AD conversion part.

11. A camera system comprising:
    a solid-state image sensing device; and
    an optical system that forms an object image on the solid-state image sensing device,
    the solid-state image sensing device including
    a pixel part in which plural pixels are arranged in a matrix, and
    a pixel signal readout part including an AD conversion part that analog-digital (AD)-converts pixel signals read out from the pixel part,
    wherein each of plural adjacent pixels or individual pixels of the pixel part are respectively constituted as plural divided pixels that are divided into regions with different photosensitivity or amounts of accumulated charge,
    plural photosensitivity or exposure time conditions are respectively set for the plural divided pixels, with the photosensitivity or exposure time conditions of the divided pixels that are opposed in diagonal directions being set to the same conditions,
    the pixel signal readout part reads out divided pixel signals respectively corresponding to the divided pixels, and
    the AD conversion part obtains a given pixel signal of a given pixel by AD-converting and adding respective ones of the divided pixel signals that correspond to the given pixel.

12. The camera system according to claim 11, further comprising a processing part that obtains a final output by obtaining an optimal multiplying factor from an output value of the pixel signal readout part and multiplying the output value by the obtained multiplying factor.

13. The camera system according to claim 11, wherein a pixel signal that is readout part time-sequentially includes reading out the divided pixel signals of the respective divided pixels to a signal line, wherein
    the AD conversion part sequentially performs processing of AD-converting the divided pixel signal input through the signal line and, at AD-conversion of the next divided pixel signal, adding the previous AD-converted value and AD-converting the next divided pixel signal.

14. The camera system according to claim 13, wherein an individual pixel having plural divided pixels includes:
    plural photoelectric conversion elements provided with respect to each divided pixel;
    a shared floating diffusion part formed in common among the respective divided pixels; and
    an amplification part formed in common among the respective divided pixels, and
    the pixel signal readout part transfers the divided pixel signals photoelectrically converted by the photoelectric conversion elements of the respective divided pixels to the amplification part through the shared floating diffusion part and amplifies the signals, and time-sequentially sends out the amplified divided pixel signals to the signal line.

15. The camera system according to claim 13, wherein an individual pixel having plural divided pixels includes:
   plural photoelectric conversion elements provided with respect to each divided pixel;
   plural floating diffusion parts provided with respect to each divided pixel; and
   an amplification part formed in common among the respective divided pixels, and
   the pixel signal readout part transfers the divided pixel signals photoelectrically converted by the photoelectric conversion elements of the respective divided pixels to the amplification part through the floating diffusion parts and amplifies the signals, and time-sequentially sends out the amplified divided pixel signals to the signal line.

16. The camera system according to claim 13, wherein an individual pixel having plural divided pixels is segmented into plural groups and includes:
   plural photoelectric conversion elements provided with respect to each divided pixel;
   plural shared floating diffusion parts formed in common among the groups of the respective divided pixels; and
   an amplification part formed in common among the respective groups, and
   the pixel signal readout part transfers the divided pixel signals photoelectrically converted by the photoelectric conversion elements of the respective divided pixels to the amplification part through the shared floating diffusion parts corresponding to the groups and amplifies the signals, and time-sequentially sends out the amplified divided pixel signals to the signal line.

17. The camera system according to claim 13, wherein an individual pixel having plural divided pixels includes:
   plural photoelectric conversion elements provided with respect to each divided pixel;
   plural floating diffusion parts provided with respect to each divided pixel; and
   amplification parts provided with respect to each divided pixel, and
   the pixel signal readout part transfers the divided pixel signals photoelectrically converted by the photoelectric conversion elements of the respective divided pixels to the amplification parts through the floating diffusion parts and amplifies the signals, and time-sequentially sends out the amplified divided pixel signals to the signal line.

18. The camera system according to claim 13, wherein an individual pixel having plural divided pixels includes:
   plural photoelectric conversion elements provided with respect to each divided pixel; and
   plural floating diffusion parts provided with respect to each divided pixel,
   the pixel signal readout part includes an amplification part, and respectively sends out the divided pixel signals photoelectrically converted by the photoelectric conversion elements of the respective divided pixels to different signal lines through the respective floating diffusion parts in parallel, and
   the AD conversion part obtains a whole pixel signal by AD-converting the plural divided pixel signals amplified in the amplification part in parallel and sequentially adding the AD-converted values at plural times.

19. The camera system according to claim 18, wherein the AD conversion part obtains the whole pixel signal by stopping AD conversion processing at times when the plural amplified divided pixel signals are respectively saturated and sequentially adding the AD-converted values at plural times.

20. The camera system according to claim 13, wherein an individual pixel having plural divided pixels includes plural photoelectric conversion elements provided with respect to each divided pixel,
   the pixel signal readout part includes:
      a first transfer register that transfers the divided pixel signals in a column direction;
      a second transfer register that transfers the divided pixel signals in a direction orthogonal to the transfer direction of the first transfer register; and
      a floating diffusion part to which the divided pixel signals transferred through the second transfer register are supplied, and
   the pixel signal readout part time-sequentially sends out the divided pixel signals photoelectrically converted by the photoelectric conversion elements of the respective divided pixels to the first transfer register and the second transfer register, amplifies the signals through the floating diffusion part, performs correlated double sampling processing thereon, and performs the AD conversion thereon in the AD conversion part.

* * * * *